(12) United States Patent
Kikuchi

(10) Patent No.: US 9,343,467 B2
(45) Date of Patent: May 17, 2016

(54) SEMICONDUCTOR DEVICE

(71) Applicant: KABUSHIKI KAISHA TOSHIBA, Tokyo (JP)

(72) Inventor: Kenrou Kikuchi, Yokkaichi Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/631,774

(22) Filed: Feb. 25, 2015

(65) Prior Publication Data

US 2016/0064395 A1 Mar. 3, 2016

Related U.S. Application Data

(60) Provisional application No. 62/043,058, filed on Aug. 28, 2014.

(51) Int. Cl.

| H01L 29/788 | (2006.01) |
| H01L 27/115 | (2006.01) |
| H01L 29/06 | (2006.01) |
| H01L 23/528 | (2006.01) |
| H01L 29/66 | (2006.01) |

(52) U.S. Cl.
CPC ...... *H01L 27/11521* (2013.01); *H01L 23/5283* (2013.01); *H01L 27/11519* (2013.01); *H01L 27/11524* (2013.01); *H01L 29/0653* (2013.01); *H01L 29/66825* (2013.01); *H01L 29/788* (2013.01)

(58) Field of Classification Search
CPC .......... H01L 27/11521; H01L 27/11524; H01L 29/66825; H01L 23/5283; H01L 27/11519; H01L 29/0653; H01L 29/788
See application file for complete search history.

(56) References Cited

U.S. PATENT DOCUMENTS

| 5,610,418 A | * | 3/1997 | Eimori | ............. H01L 27/10817 257/296 |
| 7,875,982 B2 | | 1/2011 | Abe | |
| 8,169,824 B2 | | 5/2012 | Endo et al. | |
| 2001/0002713 A1 | * | 6/2001 | Goda | ............... H01L 21/76877 257/315 |

(Continued)

FOREIGN PATENT DOCUMENTS

JP 2009188204 8/2009

*Primary Examiner* — Victor A Mandala
(74) *Attorney, Agent, or Firm* — Patterson & Sheridan, LLP

(57) ABSTRACT

According to this embodiment, a semiconductor device includes a semiconductor substrate, element formation regions that are formed in a line-and-space pattern in a surface layer portion of the semiconductor substrate to extend in a first direction, a coupling portion that is formed in the surface layer portion of the semiconductor substrate to couple the element formation regions adjacent to each other in a second direction intersecting the first direction, a source line that is disposed in an upper layer of the semiconductor substrate through an insulating film, a source line contact, having a circular shape or an elliptical shape, that is provided to electrically connect a source region pattern and the source lines by passing through the insulating film, when a region including the coupling portion and portions of the element formation regions coupled by the coupling portion is set to the source region pattern, and a bit line contact, having a circular shape or an elliptical shape, that is provided to electrically connect the element formation regions and a wiring layer located in an upper layer by passing through the insulating film.

20 Claims, 17 Drawing Sheets

(56) References Cited

U.S. PATENT DOCUMENTS

2008/0277725 A1* 11/2008 Shino .................... H01L 21/84
　　　　　　　　　　　　　　　　　257/347
2010/0085813 A1* 4/2010 Shino .................... G11C 11/404
　　　　　　　　　　　　　　　　　365/185.21
2015/0372085 A1* 12/2015 Lee ..................... H01L 29/0692
　　　　　　　　　　　　　　　　　257/387

* cited by examiner

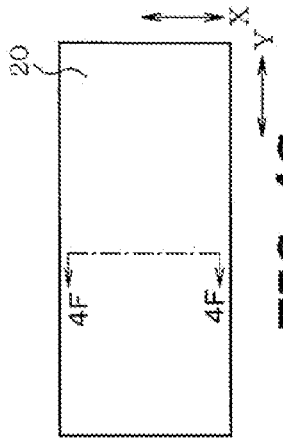
FIG. 4C
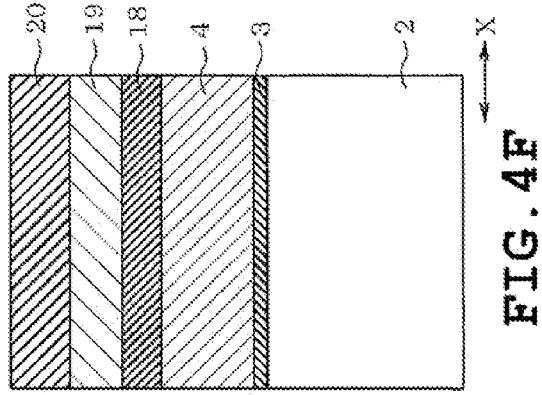
FIG. 4F
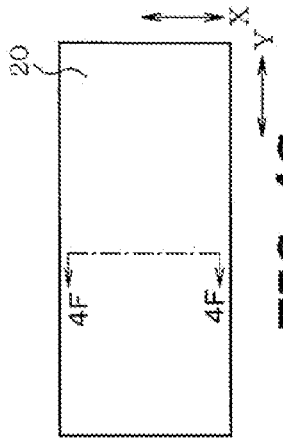
FIG. 4B
FIG. 4E
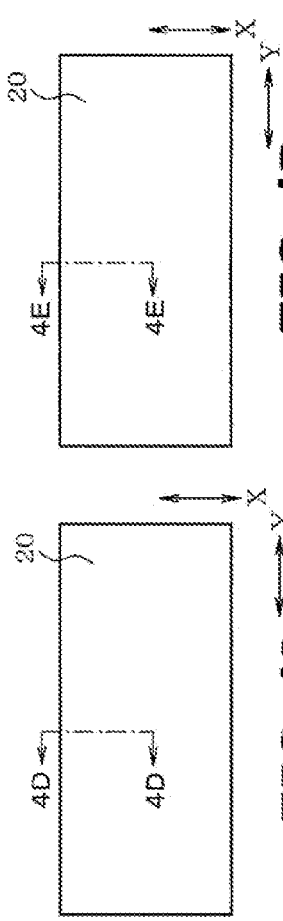
FIG. 4A
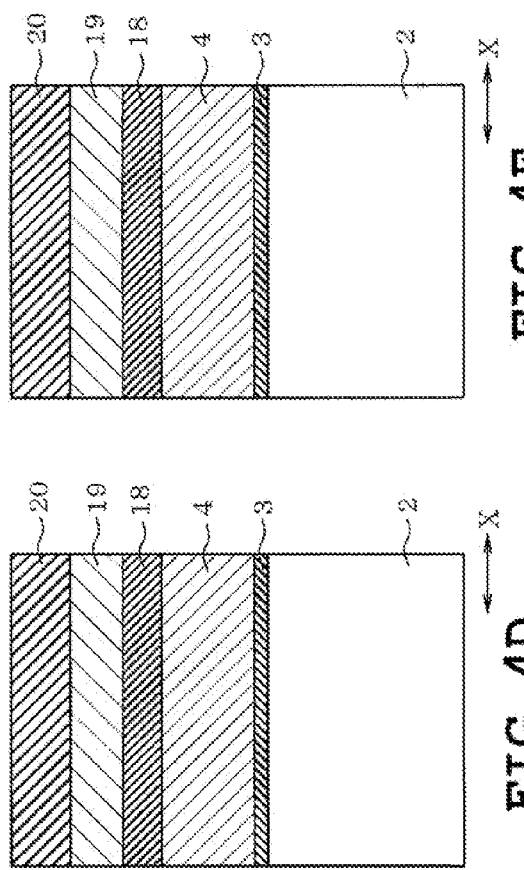
FIG. 4D

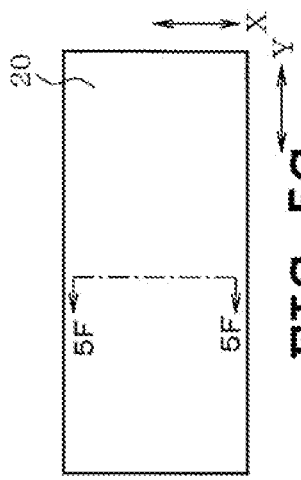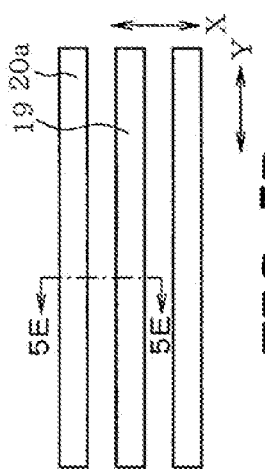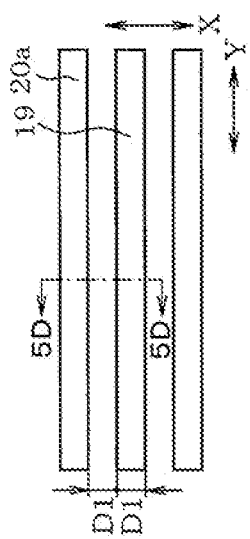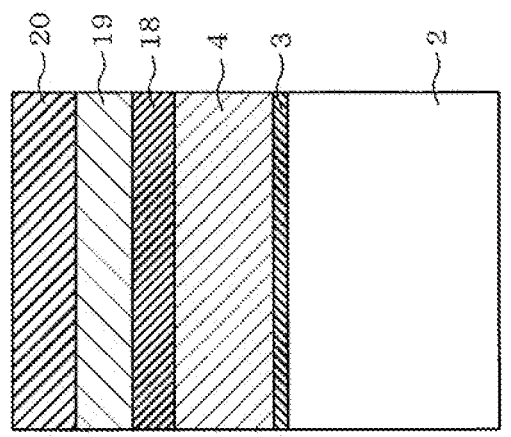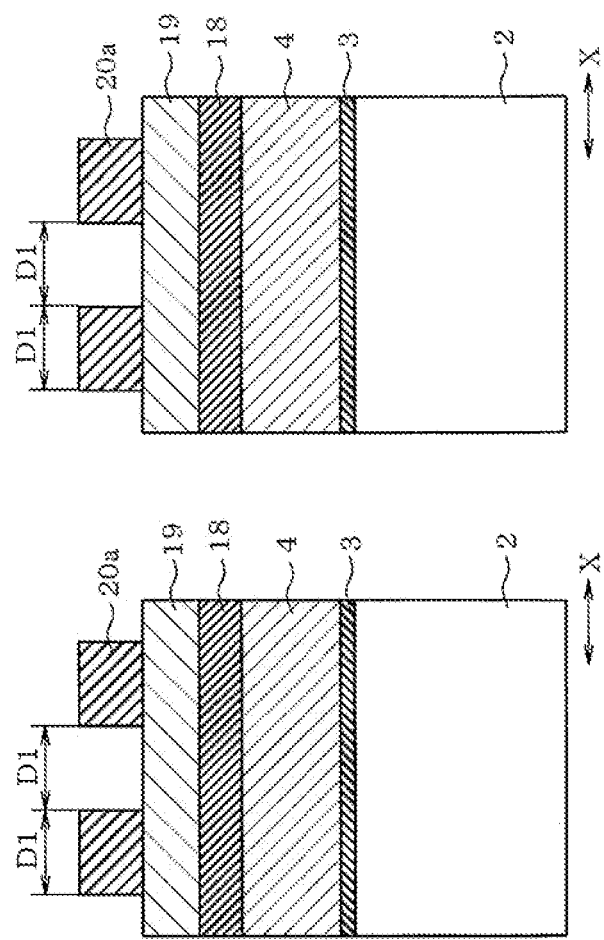

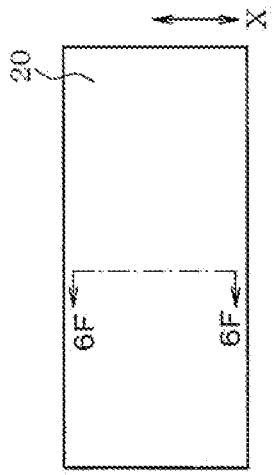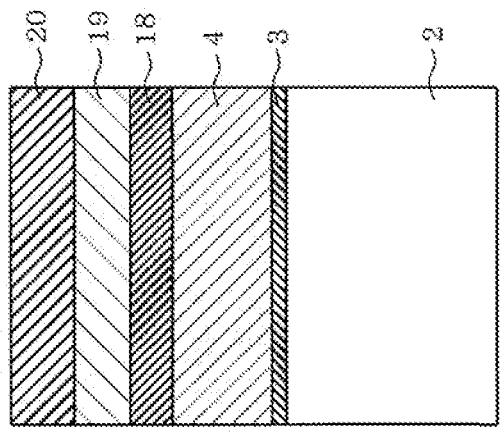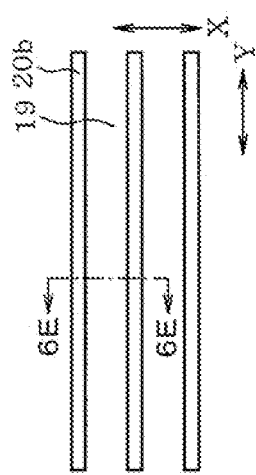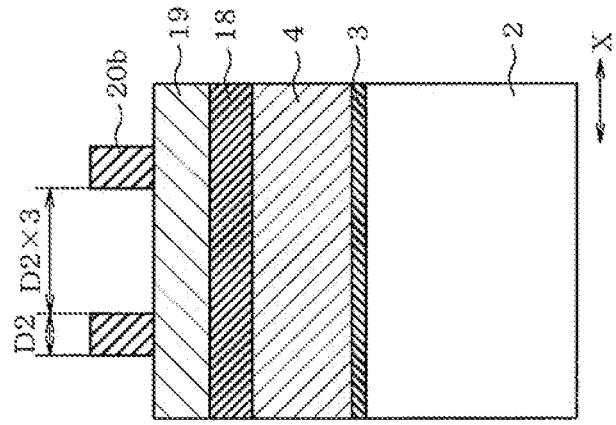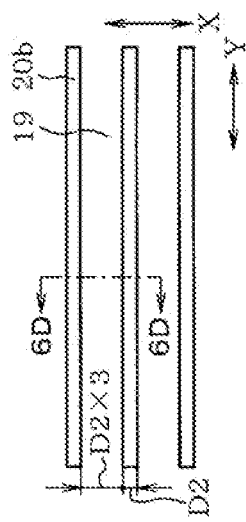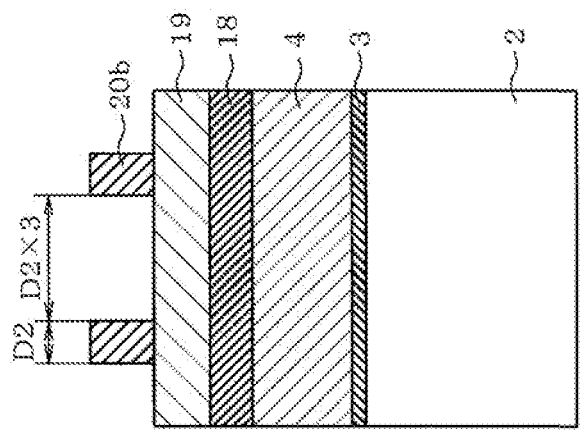

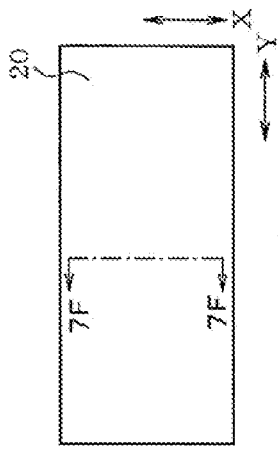
FIG. 7A
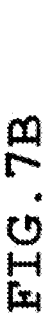
FIG. 7B
FIG. 7C
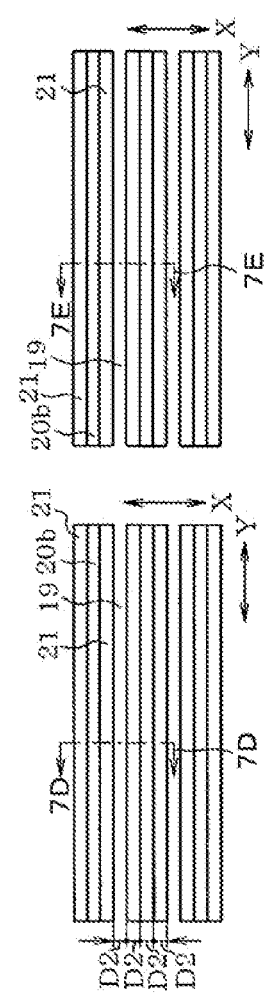
FIG. 7D
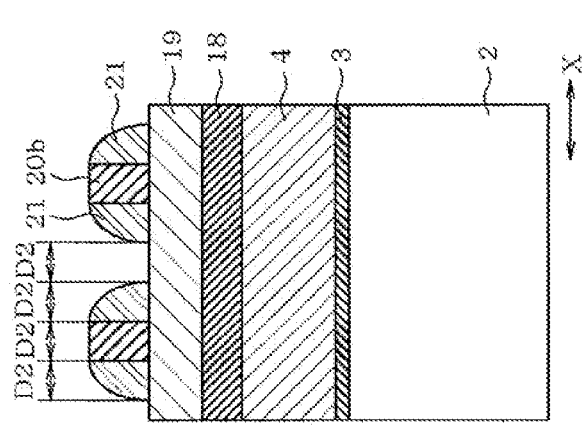
FIG. 7E
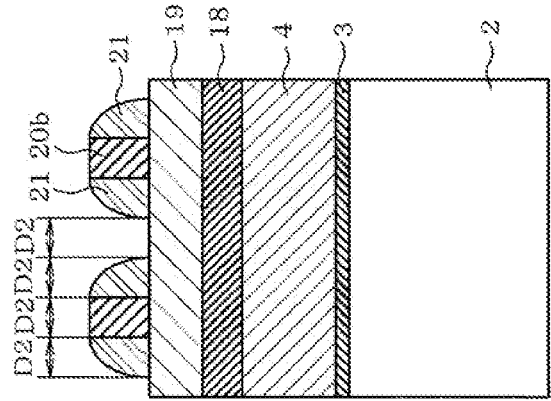
FIG. 7F

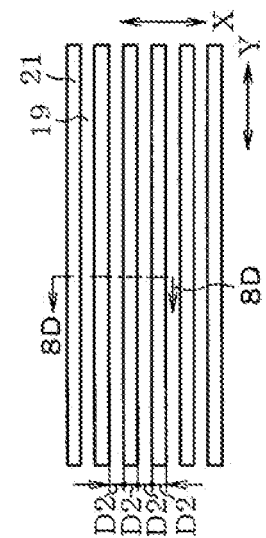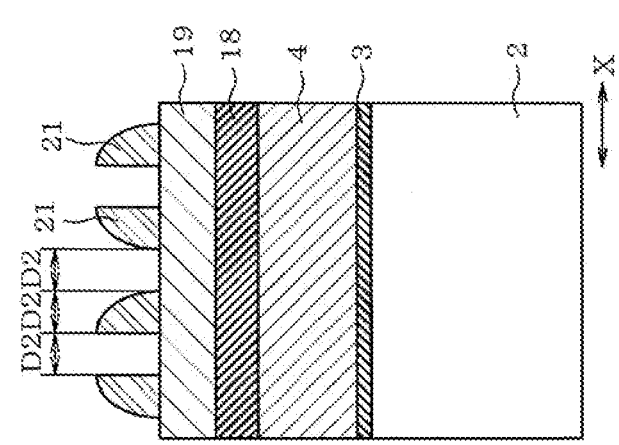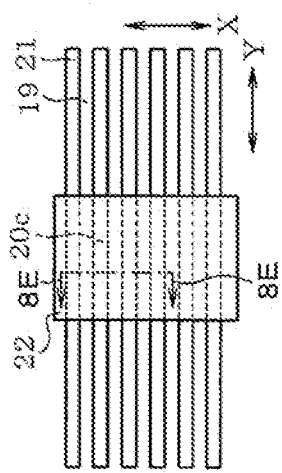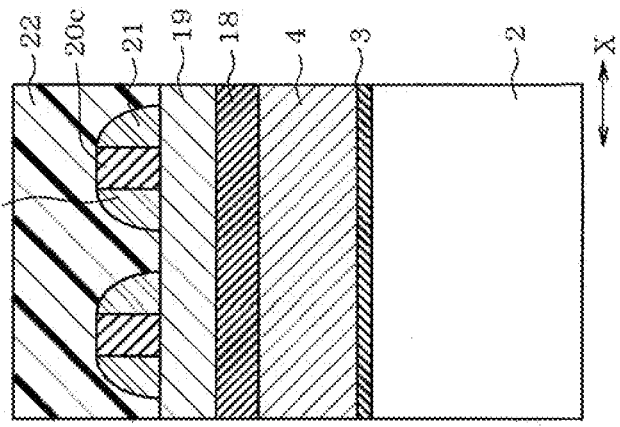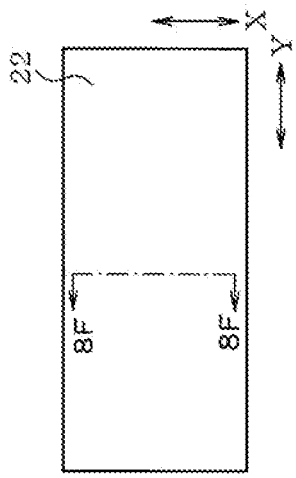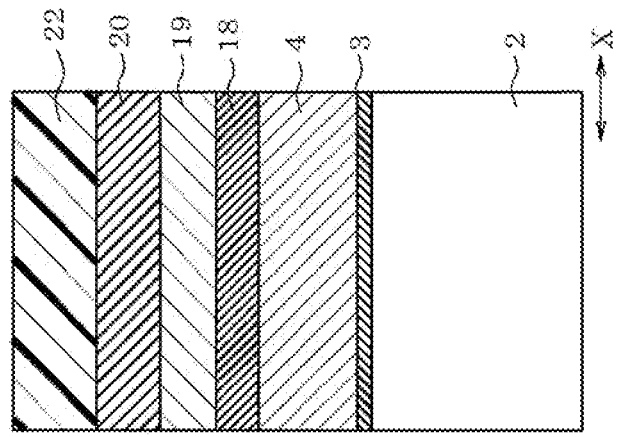

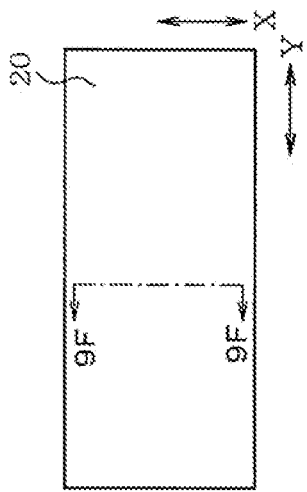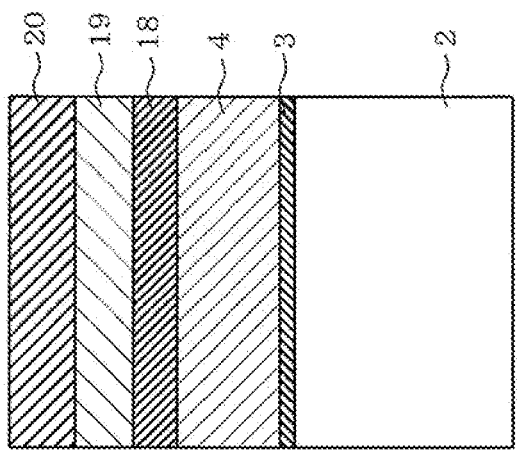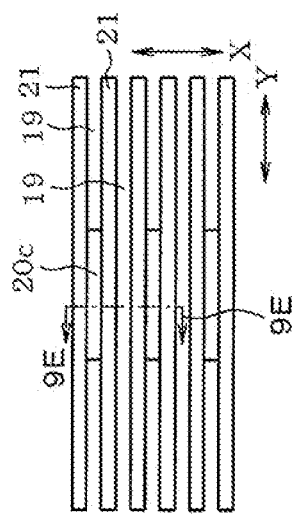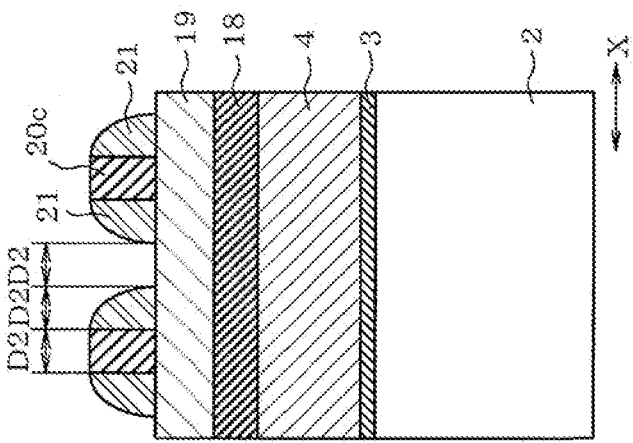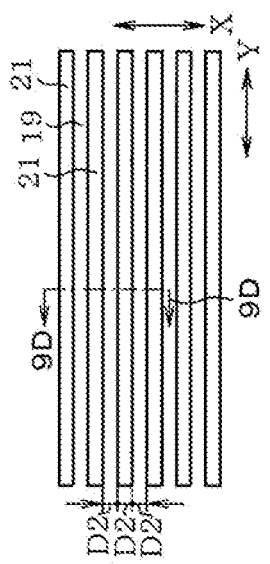

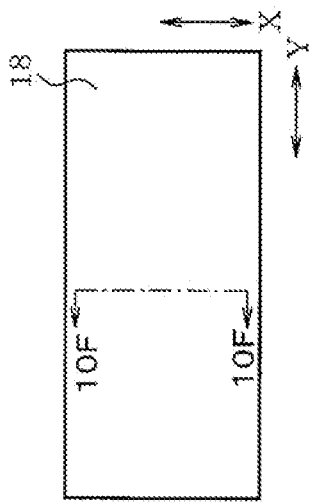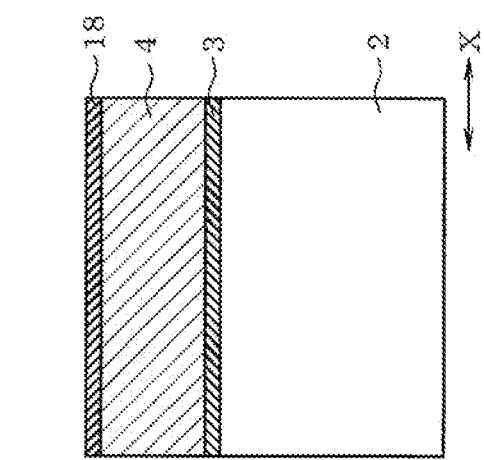
FIG. 10A  FIG. 10B  FIG. 10C
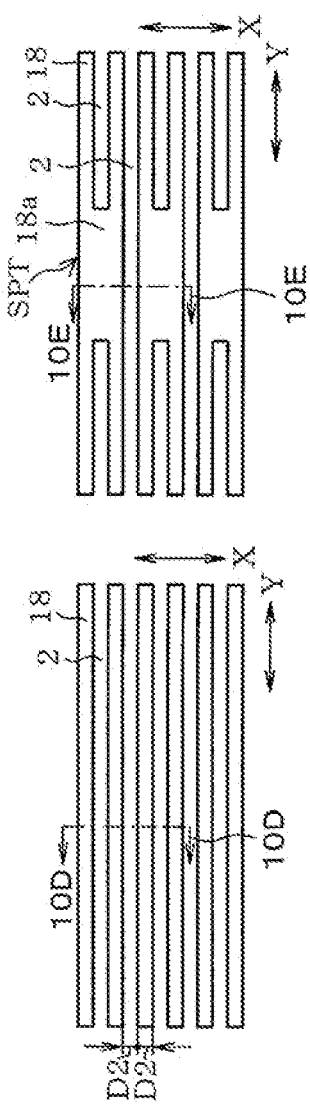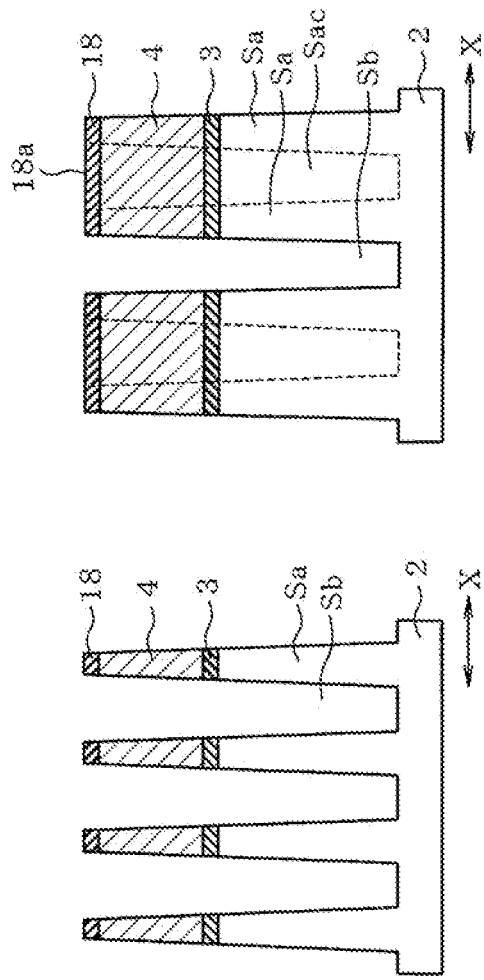
FIG. 10D  FIG. 10E  FIG. 10F

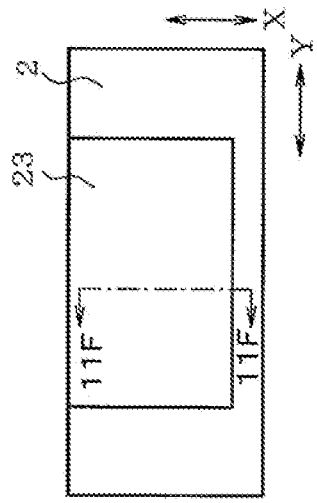
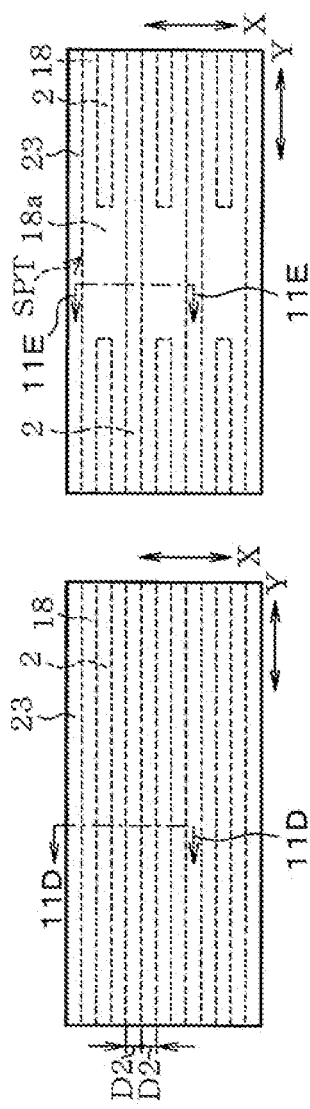
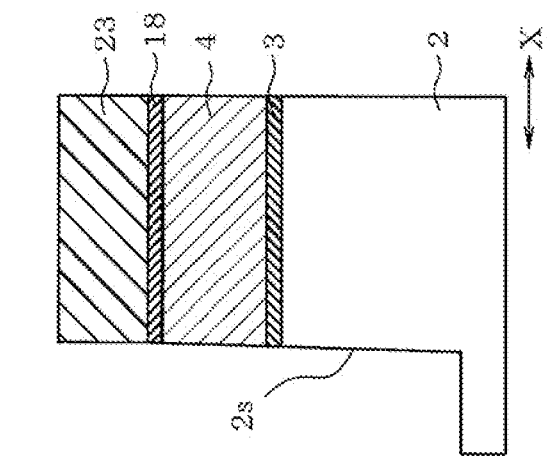
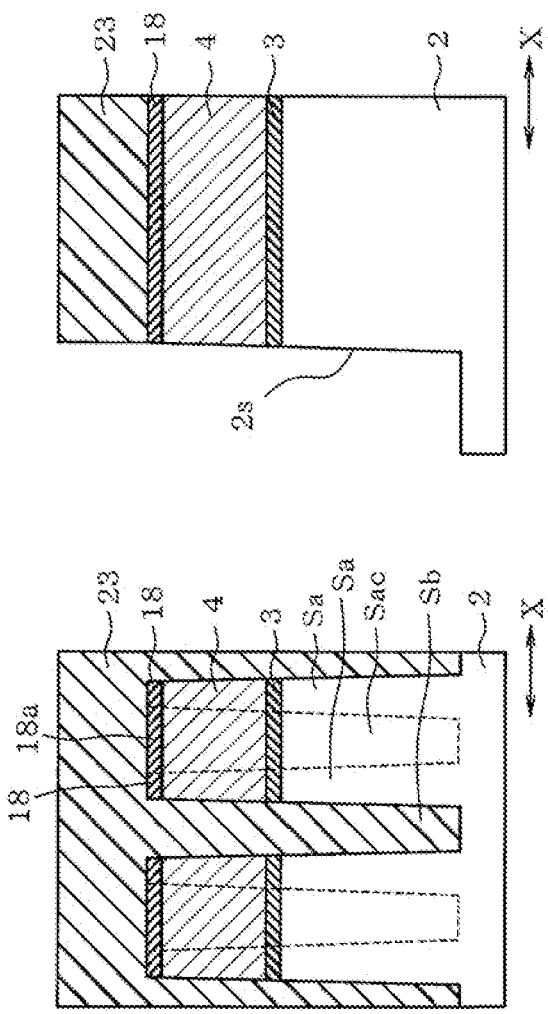
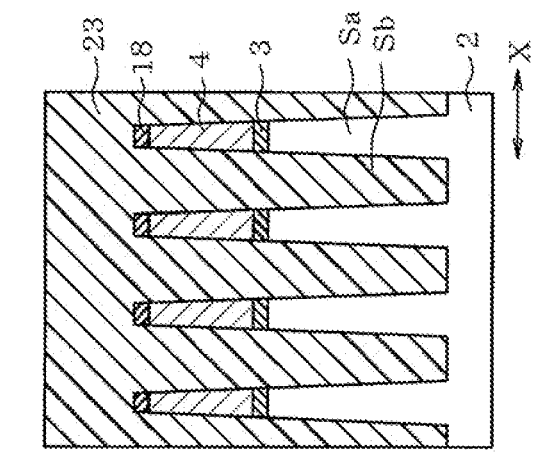

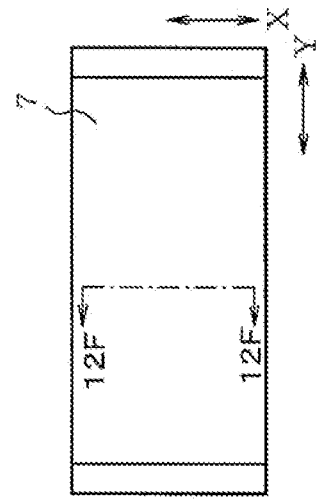
FIG.12C
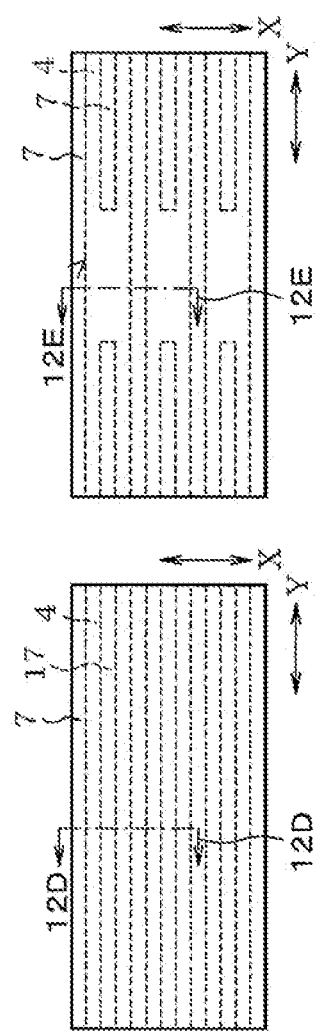
FIG.12A
FIG.12B
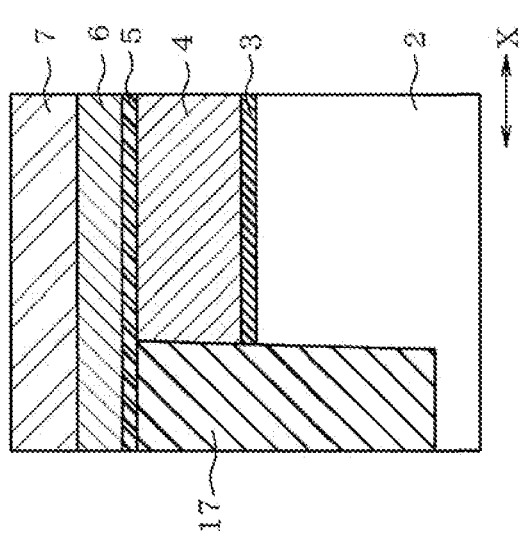
FIG.12F
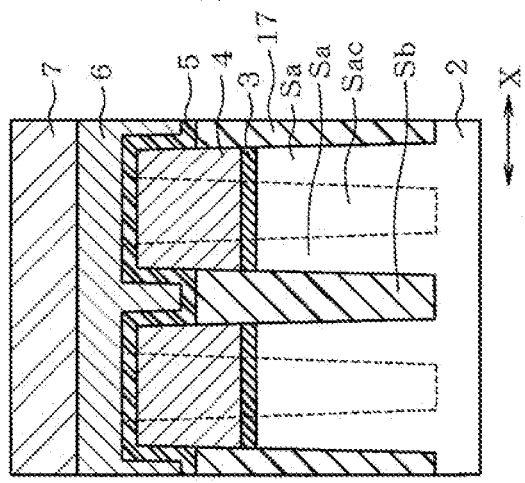
FIG.12E
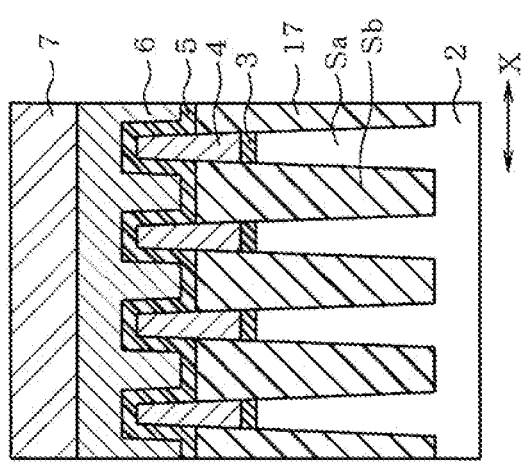
FIG.12D

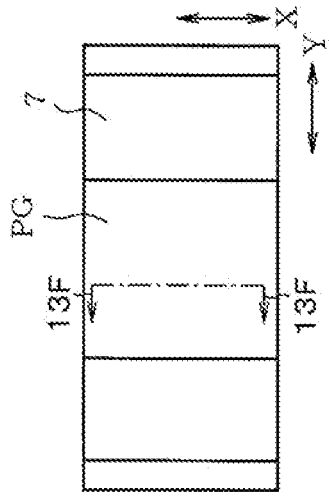
FIG. 13C
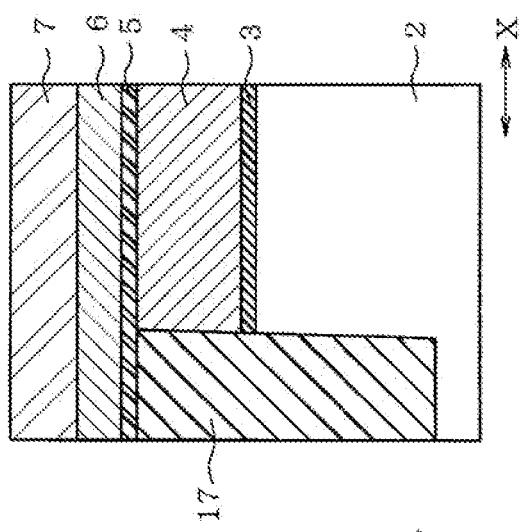
FIG. 13F
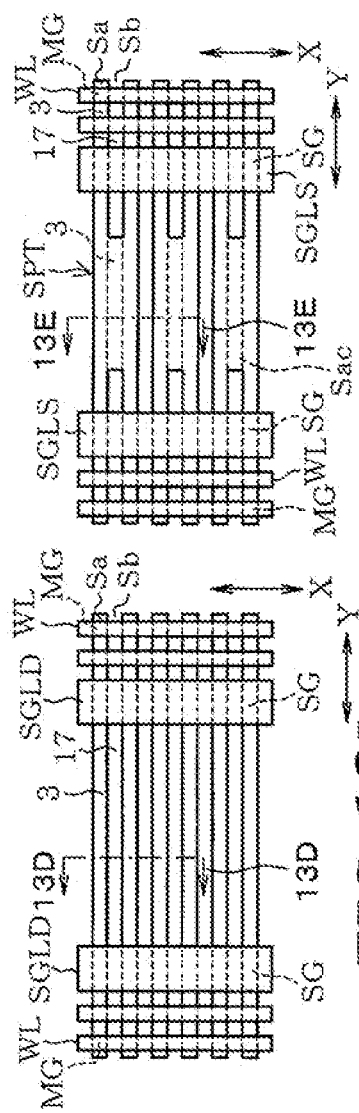
FIG. 13B
FIG. 13A
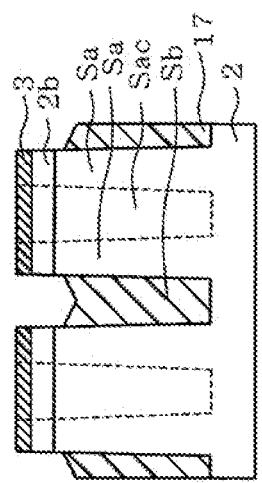
FIG. 13E
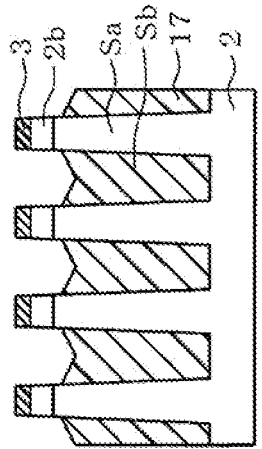
FIG. 13D

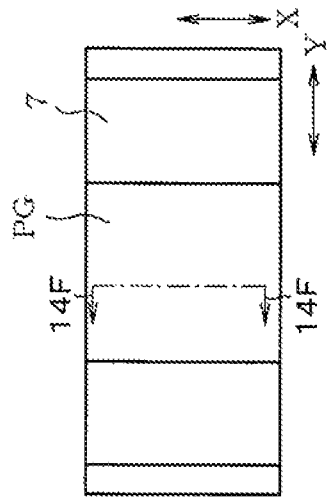
FIG. 14C
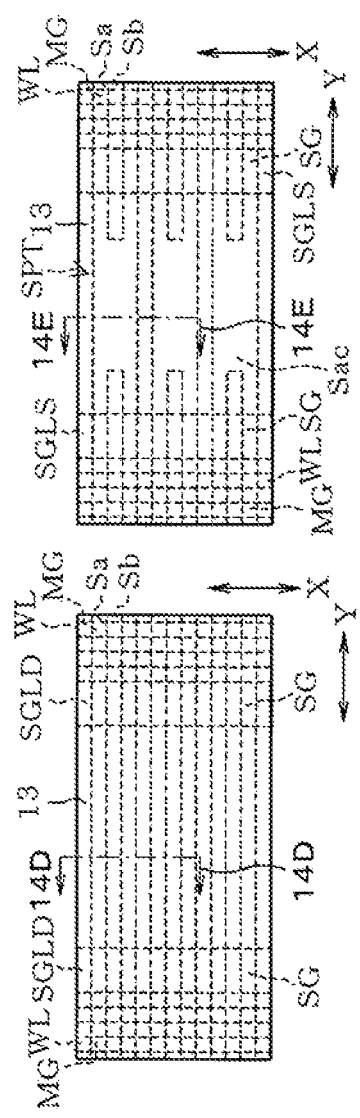
FIG. 14A
FIG. 14B
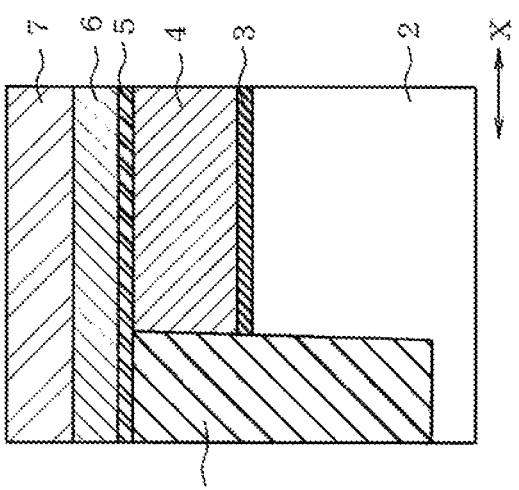
FIG. 14F
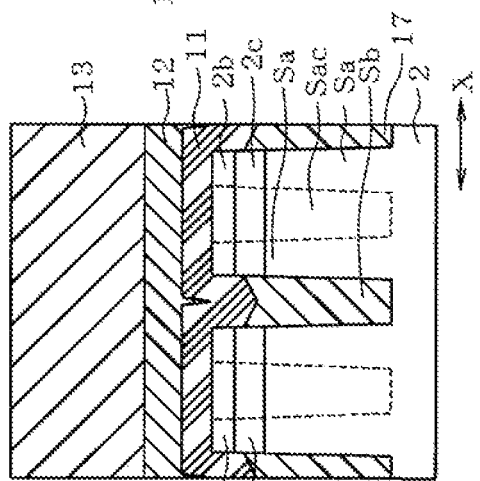
FIG. 14E
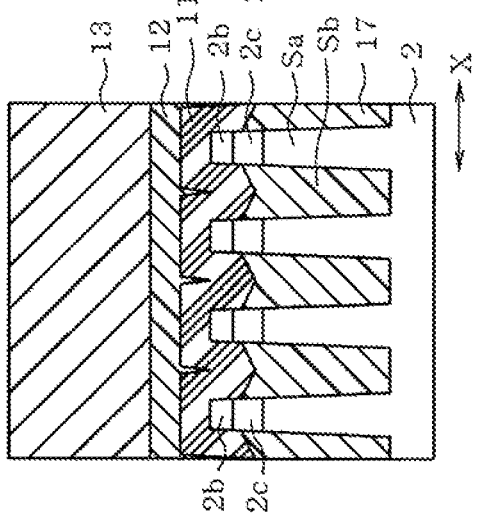
FIG. 14D

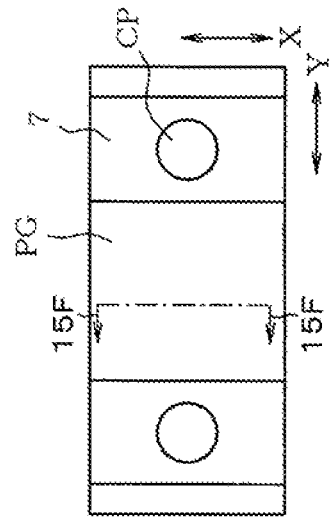
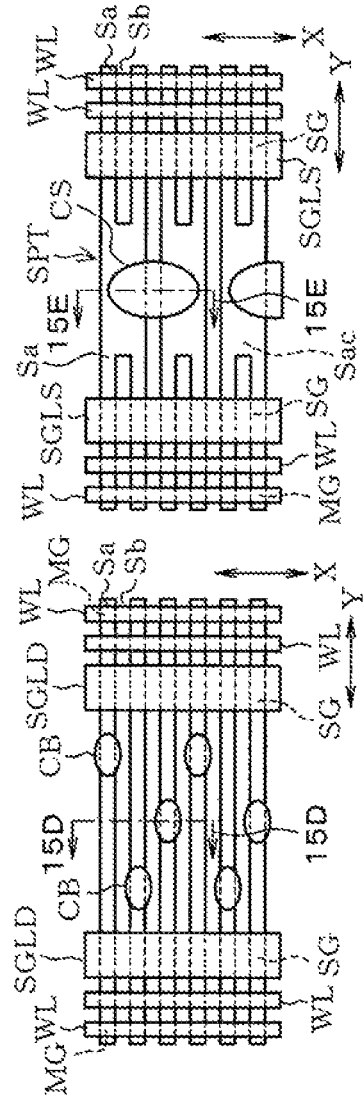
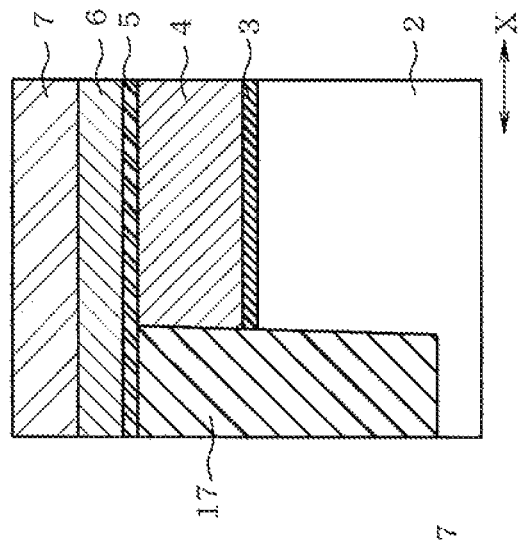
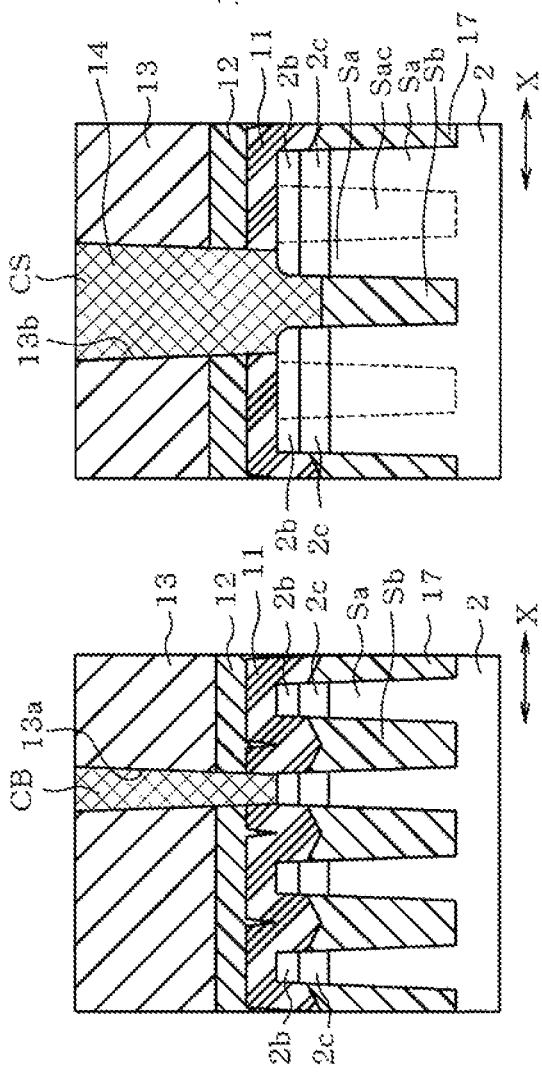
FIG.15C
FIG.15F
FIG.15B
FIG.15E
FIG.15A
FIG.15D

SEMICONDUCTOR DEVICE

FIELD

Embodiments described herein relate to a semiconductor device.

BACKGROUND

For example, in a NAND type flash memory device, a plurality of memory cell transistors are formed in an active region formed along a line direction in a semiconductor substrate, and strings each having a predetermined number of memory cell transistors, which are set to one set, are provided. A drain and a source which are located at both ends of the string are provided with a contact, and are provided with a selection gate transistor in order to cut off a current flowing through the contacts. The selection gate transistor on the drain side is a selection gate transistor STD, and the selection gate transistor on the source side is a selection gate transistor STS.

In the above-mentioned configuration, the contact of the selection gate transistor STD provided on the drain side is provided so as to come into contact with each of element formation regions corresponding to the strings. In addition, the contact of the selection gate transistor STS provided on the source side is provided so as to come into contact with the element formation regions of the plurality of strings in common. In this case, since the contact of the selection gate transistor STD on the drain side is formed for each of the strings, a contact plug is disposed which adopts a staggered disposition in which a plurality of contacts are shifted so that the adjacent contacts do not come into contact with each other. On the other hand, since the contact of the selection gate transistors STS on the source side comes into contact with the plurality of strings in common, a contact region is formed in a groove pattern to cross the element formation region.

For this reason, a density difference in processing is increased in forming a contact hole of the selection gate transistor STD on the drain side and forming a contact groove of the selection gate transistor STS on the source side. Therefore, between the contact hole on the drain side and the contact groove on the source side, a large difference in the amount of etching occurs in a layer located below the contact due to a loading effect of etching during contact processing. Accordingly, the depression of a shallow trench isolation (STI) film which is an element isolation insulating film between the element formation regions particularly becomes remarkable, and thus the contact and a diffusion layer in the element formation region approach each other in the contact groove on the source side which has a large digging amount due to the density difference, which results in the deterioration of junction leakage.

As a measure against the above-mentioned problem, for example, there is a process of connecting the element formation regions between STS and STS to thereby form a connected element formation region and removing the element isolation insulating film between the element formation regions by adding a resist covering process during the processing of the element formation region. However, this process has problems such as an increase in a chip cost due to the addition of the resist covering process and the fluctuation in a threshold value of STS which is caused by the diffusion of a dopant to the STS side due to an increase in the net amount of implantation into the diffusion layer by the connection between the element formation regions.

BRIEF DESCRIPTION OF THE DRAWINGS

FIGS. 4A to 4F are examples of a plan view and a cross-sectional view of each portion in one step of a manufacturing process; FIG. 4A is an example of a plan view of a contact region between selection gate transistors on a drain side, FIG. 4B is an example of a plan view of a contact region between selection gate transistors on a source side, FIG. 4C is an example of a plan view of a peripheral transistor, FIG. 4D is an example of a longitudinal sectional side view of a portion taken along line 4D-4D in FIG. 4A, FIG. 4E is a longitudinal sectional side view of a portion taken along line 4E-4E in FIG. 4B, and FIG. 4F is an example of a longitudinal sectional side view of a portion taken along line 4F-4F in FIG. 4C. (Part 1)

FIGS. 5A to 5F are examples of a plan view and a cross-sectional view of each portion in one step of a manufacturing process, and FIGS. 5A to 5F are examples of a plan view and a longitudinal sectional side view of portions equivalent to those in FIGS. 4A to 4F. (Part 2)

FIGS. 6A to 6F are examples of a plan view and a cross-sectional view of each portion in one step of a manufacturing process, and FIGS. 6A to 6F are examples of a plan view and a longitudinal sectional side view of portions equivalent to those in FIGS. 4A to 4F. (Part 3)

FIGS. 7A to 7F are examples of a plan view and a cross-sectional view of each portion in one step of a manufacturing process, and FIGS. 7A to 7F are examples of a plan view and a longitudinal sectional side view of portions equivalent to those in FIGS. 4A to 4F. (Part 4)

FIGS. 8A to 8F are examples of a plan view and a cross-sectional view of each portion in one step of a manufacturing process, and FIGS. 8A to 8F are examples of a plan view and a longitudinal sectional side view of portions equivalent to those in FIGS. 4A to 4F. (Part 5)

FIGS. 9A to 9F are examples of a plan view and a cross-sectional view of each portion in one step of a manufacturing process, and FIGS. 9A to 9F are examples of a plan view and a longitudinal sectional side view of portions equivalent to those in FIGS. 4A to 4F. (Part 6)

FIGS. 10A to 10F are examples of a plan view and a cross-sectional view of each portion in one step of a manufacturing process, and FIGS. 10A to 10F are examples of a plan view and a longitudinal sectional side view of portions equivalent to those in FIGS. 4A to 4F. (Part 7)

FIGS. 11A to 11F are examples of a plan view and a cross-sectional view of each portion in one step of a manufacturing process, and FIGS. 11A to 11F are examples of a plan view and a longitudinal sectional side view of portions equivalent to those in FIGS. 4A to 4F. (Part 8)

FIGS. 12A to 12F are examples of a plan view and a cross-sectional view of each portion in one step of a manufacturing process, and FIGS. 12A to 12F are examples of a plan view and a longitudinal sectional side view of portions equivalent to those in FIGS. 4A to 4F. (Part 9)

FIGS. 13A to 13F are examples of a plan view and a cross-sectional view of each portion in one step of a manufacturing process, and FIGS. 13A to 13F are examples of a plan view and a longitudinal sectional side view of portions equivalent to those in FIGS. 4A to 4F. (Part 10)

FIGS. 14A to 14F are examples of a plan view and a cross-sectional view of each portion in one step of a manufacturing process, and FIGS. 14A to 14F are examples of a plan view and a longitudinal sectional side view of portions equivalent to those in FIGS. 4A to 4F. (Part 11)

FIGS. 15A to 15F are examples of a plan view and a cross-sectional view of each portion in one step of a manufacturing process, and FIGS. 15A to 15F are examples of a plan view and a longitudinal sectional side view of portions equivalent to those in FIGS. 4A to 4F. (Part 12)

DETAILED DESCRIPTION

According to an embodiment, a semiconductor device includes a semiconductor substrate, element formation regions that are formed in a line-and-space pattern in a surface layer portion of the semiconductor substrate to extend in a first direction, a coupling portion that is formed in the surface layer portion of the semiconductor substrate to couple the element formation regions adjacent to each other in a second direction intersecting the first direction, a source line that is disposed in an upper layer of the semiconductor substrate through an insulating film, a source line contact, having a circular shape or an elliptical shape, that is provided to electrically connect a source region pattern and the source lines by passing through the insulating film, when a region including the coupling portion and portions of the element formation regions coupled by the coupling portion is set to the source region pattern and a bit line contact, having a circular shape or an elliptical shape, that is provided to electrically connect the element formation regions and a wiring layer located in an upper layer by passing through the insulating film.

First Embodiment

Hereinafter, a NAND type flash memory device according to a first embodiment will be described with reference to FIG. 1 to FIGS. 15A to 15F. In addition, the drawings are schematically illustrated, and a relationship between a thickness and a planar size, a thickness ratio of each layer, and the like do not necessarily coincide with those in an actual device. In addition, horizontal and vertical directions indicate relative directions when a circuit formation surface side in a semiconductor substrate to be described later faces upwards, and the directions do not necessarily coincide with directions based on a gravitational acceleration direction.

Figure 1:
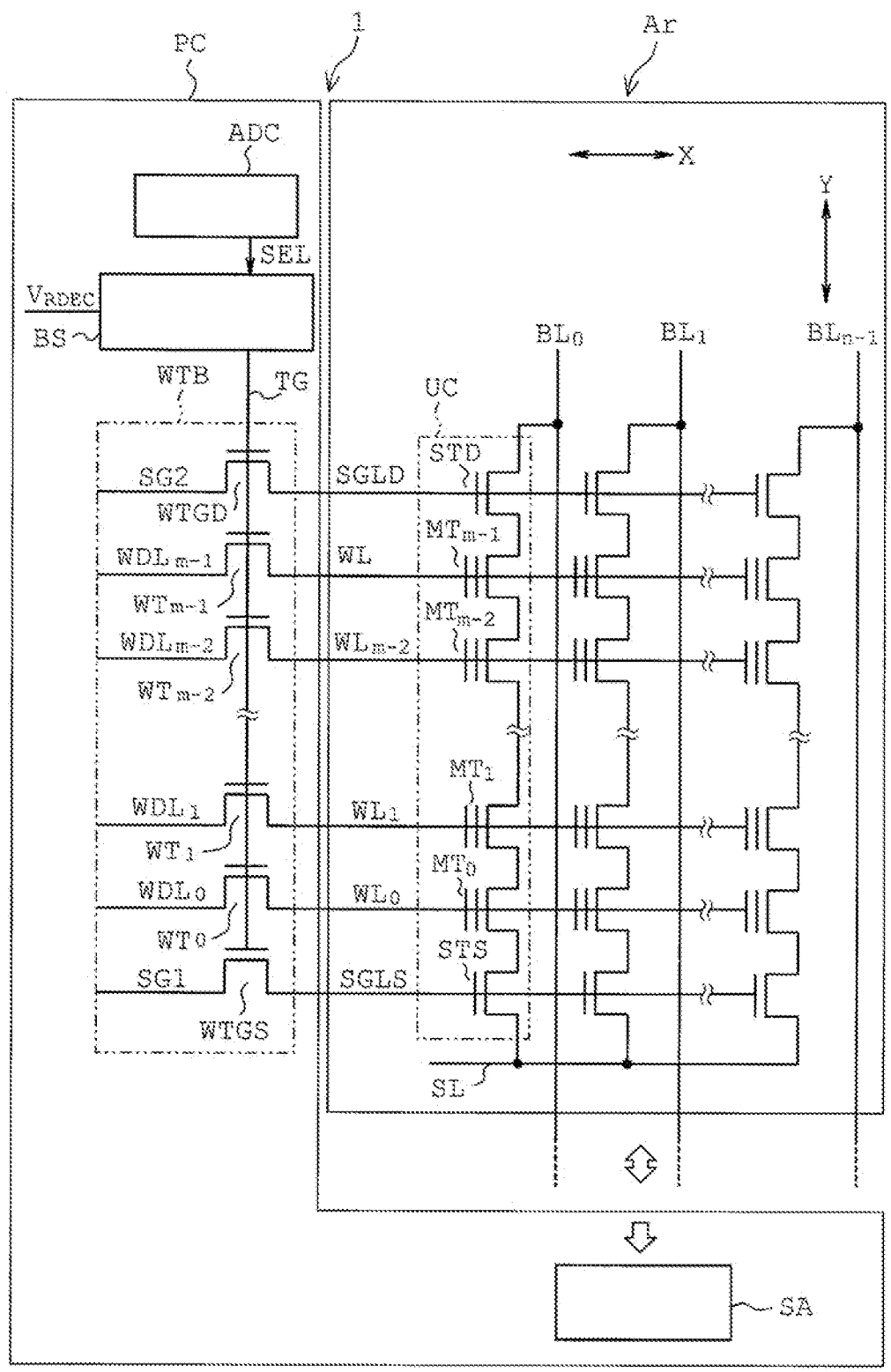
FIG. 1 is an example of an equivalent circuit illustrating a schematic electrical configuration of a memory cell region according to a first embodiment.

FIG. 1 is a schematic block diagram illustrating an electrical configuration of a NAND type flash memory device. As illustrated in FIG. 1, a NAND type flash memory device 1 includes a memory cell array Ar in which a large number of memory cells are disposed in matrix form, a peripheral circuit PC that reads, writes, and erases the memory cells of the memory cell array Ar, an input and output interface circuit not illustrated in the drawing, and the like.

In the memory cell array Ar, a plurality of cell units UC are disposed. In the cell unit UC, a selection gate transistor STD connected to each of bit lines $BL_0 \ldots BL_{n-1}$ sides, a selection gate transistor STS connected to a source line SL side, and for example, thirty-two memory cell transistors $MT_0 \ldots MT_{m-1}$ disposed between two selection gate transistors STD and STS are connected to each other in series. Meanwhile, in addition to $2^k$ memory cell transistors $MT_0$ to $MT_{m-1}$, a plurality of dummy cells may be connected in series between the two selection gate transistors STD and STS. Gate electrodes MG of the respective memory cell transistors $MT_0$ to $MT_{m-1}$ of the plurality of cell units UC, which are disposed in the X direction, are electrically connected to each other by word lines WL.

In one block, n columns of cell units UC are arrayed next to each other in an X direction (row direction; horizontal direction of FIG. 1) which is a first direction. In the memory cell array Ar, a plurality of blocks are arrayed in a Y direction (column direction; vertical direction in FIG. 1) which is a second direction. As illustrated in the drawing, a bit line contact CB is disposed in a region between the disposed selection gate transistors STD of the cell units UC adjacent to each other in the Y direction, and the bit line contact is connected to the bit line BL disposed on the upper side. In addition, the source line SL connecting in common the cell units UC disposed in the X direction is connected to a region between the selection gate transistors STS which are disposed. In addition, FIG. 1 illustrates one block for the purpose of simplifying the description.

A peripheral circuit region is provided in the periphery of the memory cell region, and the peripheral circuit PC is disposed in the periphery of the memory cell array Ar. The peripheral circuit PC includes an address decoder ADC, a sense amplifier SA, a booster circuit (booster circuit) BS including a charge pump circuit, a transfer transistor WTB, and the like. The address decoder ADC is electrically connected to the transfer transistor WTB through the booster circuit BS. The peripheral circuit PC includes a resistive element R as a peripheral circuit element.

The address decoder ADC selects one block B in response to an address signal applied thereto from the outside. The booster circuit BS is supplied with a driving voltage $V_{RDEC}$ from the outside of the address decoder ADC. When a selection signal SEL of the block B is applied, the booster circuit boosts the driving voltage $V_{RDEC}$ to thereby supply a predetermined voltage to transfer gate transistors WTGD, WTGS, and $WT_0$ to $WT_{m-1}$ through a transfer gate line TG.

The transfer transistors WTB include the transfer gate transistor WTGD provided with corresponding to the selection gate transistor STD, the transfer gate transistor WTGS provided corresponding to the selection gate transistors STS, the word line transfer gate transistors $WT_0$ to $WT_{m-1}$ provided with corresponding to the respective memory cell transistors $MT_0$ to $MT_{m-1}$, and the like. The transfer transistors WTB are provided in each block B.

One of a drain and a source of the transfer gate transistor WTGD is connected to a selection gate driver line SG2, and the other is connected to a selection gate line SGLD. One of a drain and a source of the transfer gate transistor WTGS is connected to a selection gate driver line SG1, and the other is connected to a selection gate line SGLS. In each of the transfer gate transistors $WT_0$ to $WT_{m-1}$, one of a drain and a source thereof is connected to each of the word line driving signal lines $WDL_0$ to $WDL_{m-1}$, and the other is connected to each of the word lines $WL_0$ to $WL_{m-1}$ provided within the memory cell array Ar (memory cell region M).

The gate electrodes SG of the selection gate transistors STD in the plurality of cell units UC arrayed in the X direction, are electrically connected to each other by the selection gate line SGLD. Similarly, the gate electrodes SG of the selection gate transistors STS in the plurality of cell units UC arrayed in the X direction, are electrically connected to each other by the selection gate line SGLS. Sources of the selection gate transistors STS are connected in common to the source line SL. Meanwhile, in the description of FIG. 2 and the subsequent drawings, the selection gate transistors STD and STS will be referred to as a selection gate transistor ST in portions in which the description of a structure is given.

The gate electrodes MG of the memory cell transistors $MT_0$ to $MT_{m-1}$ of the plurality of cell units UC arrayed in the X direction are electrically connected to each other by the word lines $WL_0$ to $WL_{m-1}$. The memory cell transistors $MT_0$ to $MT_{m-1}$ will be referred to as a memory cell transistor Trm in the description of FIG. 2 and the subsequent drawings.

The gate electrodes of the transfer gate transistors WTGD, WTGS, and $WT_0$ to $WT_{m-1}$, are connected to each other in common by the transfer gate line TG and are connected to a boosting voltage supply terminal of the booster circuit BS. The sense amplifier SA is connected to the bit lines $BL_0$ to $BL_{m-1}$, and is connected to a latch circuit that temporarily stores data when the data in read out. Meanwhile, in the description of FIG. 2 and the subsequent drawings, the selection gate transistors STD and STS will be referred to as a selection gate transistor ST in portions in which the description of a structure is given. In addition, a transistor formed in the peripheral circuit region will be referred to as PT.

Figure 2:
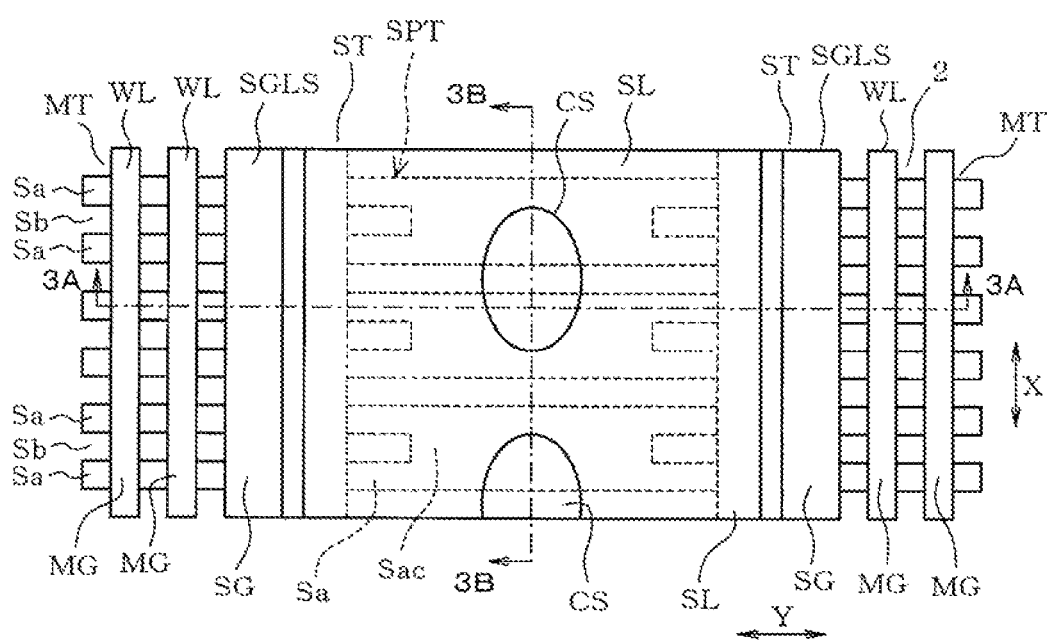
FIG. 2 is an example of a plan view illustrating a layout of a region where a source line contact is formed in the memory cell region.

FIG. 2 illustrates an example of a layout pattern of a portion in which the memory cell transistors MT and the gate transistors ST on the source side of a memory cell region are formed. As illustrated in FIG. 2, in a memory cell region of a p-type silicon substrate 2 as a semiconductor substrate, an element isolation area Sb having a shallow trench isolation (STI) structure where an insulating film is embedded in an element isolation groove is formed to extend in the Y direction in FIG. 2. The plurality of element isolation areas Sb are formed at predetermined intervals in the X direction in FIG. 2. Accordingly, element formation regions Sa are formed to extend in the Y direction of FIG. 2, and thus and the plurality of element formation regions Sa are formed on the surface layer portion of the silicon substrate 2 in a state where the element formation regions are separated from each other in the X direction. In this case, the element formation region Sa and the element isolation area Sb may be formed to have a width which is equal to or less than an exposure limit of a lithography technique using, for example, a sidewall transfer technique.

The word lines WL are formed to extend in a direction perpendicular to and crossing the element formation region Sa, that is, the X direction in FIG. 2. The plurality of word lines WL are formed spaced apart at predetermined intervals in the Y direction in FIG. 2. The gate electrode MG of the memory cell transistor MT is formed above the element formation region Sa crossing the word line WL.

The plurality of memory cells transistors MT adjacent to one another in the Y direction serve as a portion of a NAND string (memory cell string). A selection gate transistor ST is provided adjacent to both outer sides of each of the memory cell transistors MT extending in the Y direction at both ends of the NAND string. A plurality of selection gate transistors ST are provided spaced in the X direction, and the gate electrodes SG of the plurality of selection gate transistors ST are electrically connected to each other through the selection gate line SGLS. Meanwhile, the gate electrode SG of the selection gate transistor ST is formed on the element formation region Sa intersecting the selection gate line SGLS.

In a portion in which the selection gate transistors ST (STS) on the source side are disposed in the Y direction, a source region pattern SPT for forming a source line contact CS is provided. As described above, in the source region pattern SPT, the element formation regions Sa are disposed to extend in the Y direction and are disposed in a state where a pair of two element formation regions disposed in the X direction are coupled to each other by a coupling portion Sac. The coupling portion Sac is located between the two element formation regions Sa and is formed to have a predetermined length in the Y direction and to extend at a distance shorter than an interval between the selection gate electrodes SG in a source region between the two selection gate transistors ST. Thus, the source region pattern SPT is configured so that a width size thereof in the X direction is three times a width size of each of the element formation region Sa and the element isolation area Sb.

The source line contacts CS are provided to be electrically connected to the source region pattern SPT. The source line contacts CS are formed in a state where the source line contacts are connected to each other by the source lines SL in an upper portion. The source line contact CS for forming a contact and a source of the selection gate transistor ST is disposed to be laid over the element isolation area Sb interposed between two source region patterns SPT adjacent to each other in the X direction. A planar pattern of the source line contact CS cut by an XY plane has an elliptical shape. An upper portion of the contact plug CS is connected to the source lines SL, formed in a line shape in the X direction, which are located at an upper layer. Meanwhile, the source line contacts CS and the source lines SL are collectively formed in a state where a barrier metal is interposed therebetween.

Figure 3A:
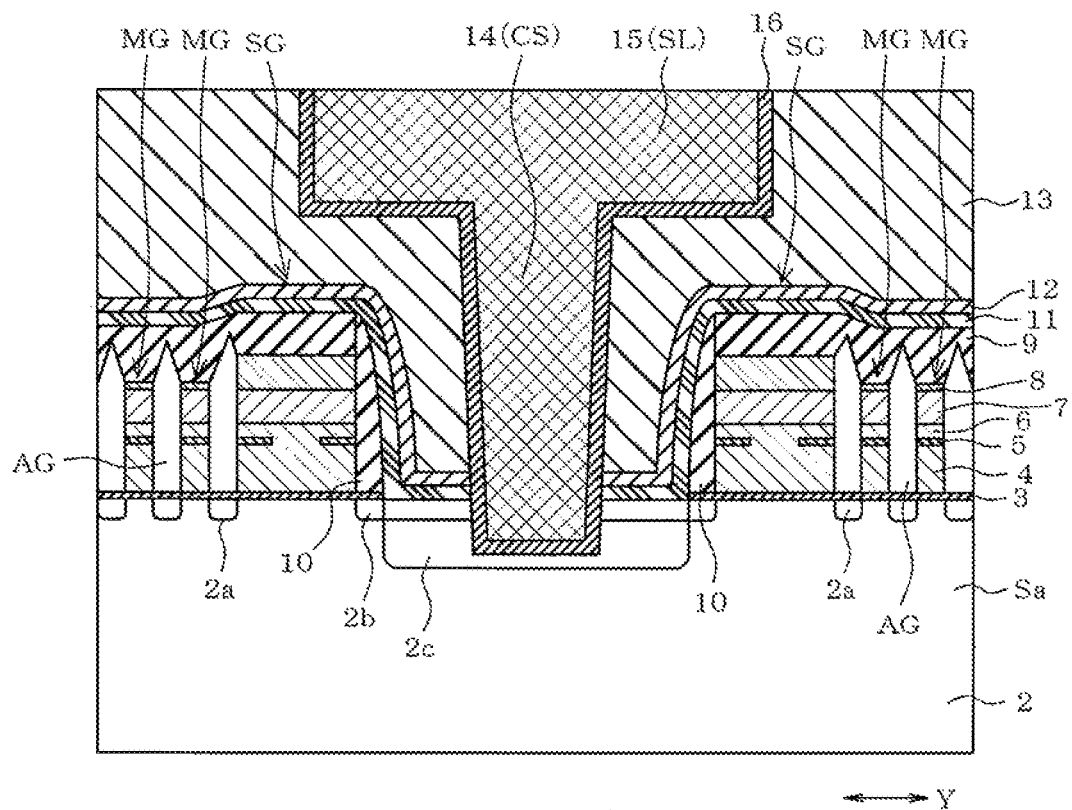
FIG. 3A is an example of a schematic longitudinal sectional side view of a portion taken along line 3A-3A in FIG. 2.
Figure 3B:
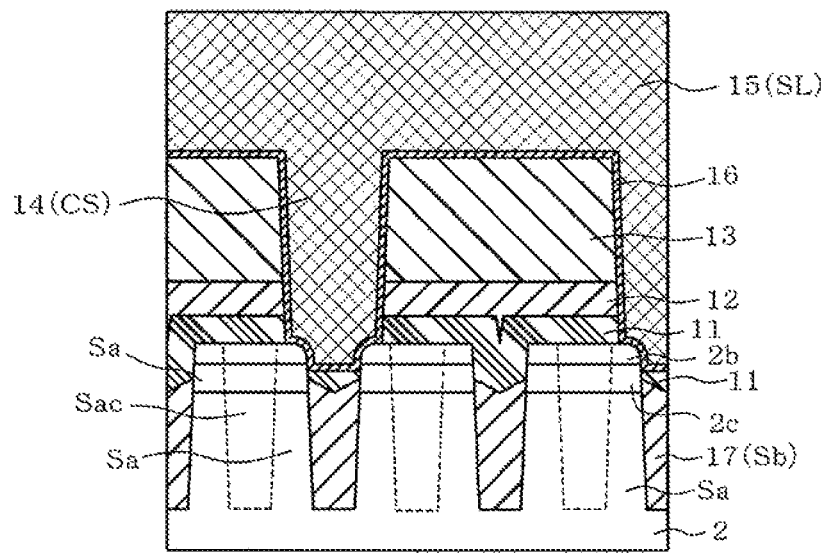
FIG. 3B is an example of a schematic longitudinal sectional side view of a portion taken along line 3B-3B in FIG. 2.

Next, an internal configuration will be described with reference to FIGS. 3A and 3B. FIG. 3A is a longitudinal sectional side view of a portion taken along line 3A-3A in FIG. 2 and illustrates a configuration in the Y direction which is cut along the element formation region Sa. In addition, FIG. 3B is a longitudinal sectional side view of a portion taken along line 3B-3B in FIG. 2 and illustrates a configuration in the X direction which is cut along the source line SL. FIGS. 3A and 3B illustrate portions of the memory cell transistor MT, the selection gate transistor ST, and the source line contact CS in the memory cell region.

In FIG. 3A, the silicon substrate 2 as a semiconductor substrate is provided with the element formation region Sa in the surface layer portion thereof. The element formation regions Sa are formed in a line shape to extend in the Y direction with a predetermined width and are insulated and separated from each other by the element isolation areas Sb adjacent thereto in the X direction. A gate insulating film 3 is formed on the top surface of the element formation region Sa. The gate electrode MG of the memory cell transistor MT and the gate electrode SG of the selection gate transistor ST are formed on the top surface of the gate insulating film 3. The memory cell transistor MT is configured to include the gate insulating film 3, the gate electrode MG, and an impurity region 2a which is a source or a drain region formed in the silicon substrate 2 on both sides of the gate electrode. The plurality of memory cell transistors MT are formed adjacent to each other in the Y direction. A pair of selection gate transistors ST are formed adjacent to ends of the memory cell transistors ST.

The gate electrode MG of a memory cell transistor MT includes a polycrystalline silicon film 4 serving as a floating gate electrode, an inter-electrode insulating film 5, polycrystalline silicon films 6 and 7 serving as control gate electrodes, and a silicon nitride film 8 on the gate insulating film 3 such as a tunnel oxide film. The inter-electrode insulating film 5 is formed using, for example, an oxide-nitride-oxide (ONO) film, a nitride-oxide-nitride-oxide-nitride (NONON) film, or an insulating film having a high dielectric constant. Meanwhile, a metal film such as a tungsten film may be formed between the polycrystalline silicon film 7 and the silicon nitride film 8.

The impurity region 2a serving as a source or a drain region is provided in surface layers of the silicon substrate 2 which are located between the gate electrodes MG and MG and between the gate electrodes SG and MG. An impurity region 2b, serving as a lightly doped drain (LDD) region, which corresponds to the impurity region 2a is provided in the surface layer of the silicon substrate 2 which is located between the gate electrodes SG and SG. The impurity regions 2a and 2b may be formed by introducing impurities into the surface layer of the silicon substrate 2. In addition, an impurity region 2c having impurities introduced thereinto at a high concentration is formed in the surface layer of the silicon substrate 2 which is located between the gate electrodes SG and SG, and thus an LDD structure is formed.

The gate electrode SG of the selection gate transistor ST has substantially the same structure as that of the gate electrode MG of the memory cell transistor MT, and is configured so that the polycrystalline silicon film 4 serving as a lower layer electrode, the inter-electrode insulating film 5, the polycrystalline silicon films 6 and 7 serving as upper layer electrodes, and the silicon nitride film 8 are stacked on the gate insulating film 3. In the gate electrode SG, a central portion of the inter-electrode insulating film 5 is provided with an opening 5a, and the polycrystalline silicon film 4 and the polycrystalline silicon films 6 and 7 are provided in a contact state and thus are electrically connected to each other.

In the gate electrodes MG and SG, an insulating film 9 for forming a gap is provided on the top surface of the silicon nitride film 8, which is located at the uppermost portion, so as to extend across and between the top surfaces of the gate electrodes MG. The insulating film 9 may be formed using, for example, a silicon oxide film. An air gap AG as a gap portion which performs insulation in a state where an insulating film is not embedded in the gap is provided between the gate electrodes MG and MG and between the gate electrodes MG and SG by the insulating film 9.

The air gap AG is not provided in portions where the gate electrodes SG and SG face each other. In these portions, a spacer 10 is provided on a side wall surface of the gate electrode SG. The spacer 10 may be formed using, for example, a silicon oxide film, and is formed from the top surface portion of the gate electrode SG to the top surface of the silicon substrate 2.

A silicon oxide film 11 and a silicon nitride film 12 are formed on the insulating film 9 to cover the insulating film 9, the surface of the spacer 10 between the gate electrodes SG and SG, and the surface of the silicon substrate 2 which is exposed to a bottom. An interlayer insulating film 13 is formed on the silicon nitride film 12 to embed the bottom between the gate electrodes SG and SG and to cover the top surfaces of the gate electrodes MG and SG.

A contact plug 14 corresponding to the source line contact CS is formed to reach the silicon substrate 2 in a concave portion region between the gate electrodes SG and SG by passing through the interlayer insulating film 13 from an upper portion to a lower portion and passing through the silicon nitride film 12 and the silicon oxide film 11. The contact plug 14 is formed so that the diameter thereof decreases toward the surface of the silicon substrate 2 from the top surface portion thereof, and is formed in a tapered (inclined) shape.

In addition, the contact plug 14 has an elliptical shape when seen from the top surface thereof, and is disposed so that the major axis direction thereof is directed in the X direction. The contact plug 14 may be formed of, for example, tungsten (W) or a polycrystalline silicon film. In addition, the top surface of the contact plug 14 is formed integrally with a conductor pattern 15 embedded in the interlayer insulating film 13 to be connected to the conductor pattern.

Meanwhile, the contact plug 14 and the conductor pattern 15 are formed by forming a thin film of a barrier metal 16 such as titanium nitride in the contact hole and the groove portion which are formed in the interlayer insulating film 13 and by embedding a conductor such as tungsten on the barrier metal 16.

Next, a cross-section illustrated in FIG. 3B illustrates a portion where the source region pattern SPT is provided in a state where two element formation regions Sa adjacent to each other in the X direction are coupled to each other by the coupling portion Sac. An element isolation groove is formed in a portion where the element formation region Sa is not coupled to the element formation region Sa adjacent thereto in the X direction, and an insulating film 17 as an element isolation insulating film formed of a coating type silicon oxide film or the like is embedded in the element isolation groove to a predetermined depth, thereby forming the element isolation area Sb. The silicon oxide film 11 is formed on the top surface of the element formation region Sa of the silicon substrate 2, is formed also within the element isolation groove, and is provided so as to cover the insulating film 17.

The contact plug 14 is disposed on the top surface of a portion adjacent to the element formation regions Sa. The contact plug is disposed to be laid over the element isolation area Sb interposed between two element formation regions Sa. In this case, a portion where the contact plug 14 is disposed in the element formation region Sa of the silicon substrate 2 is processed into a shape in which a shoulder portion is slightly rounded by etching. However, only one of both shoulder portions of the element formation region Sa has a round shape by etching, and thus it is possible to suppress a significant collapse of the entire shape.

Although not illustrated in the drawing, in a region where the selection gate transistors ST on the drain side face each other, the bit line contact CB is formed corresponding to each element formation region Sa. The bit line contact CB is provided to be connected to the bit line BL in the upper portion thereof. The bit line contact CB is formed to pass through the interlayer insulating film 13 from the upper portion to the lower portion, to pass through the silicon nitride film 12 and the silicon oxide film 11, and to reach the silicon substrate 2 in the concave portion region between the gate electrodes SG and SG. The bit line contact CB is formed so that the diameter thereof decreases toward the surface of the silicon substrate 2 from the top surface portion thereof, and is formed in a tapered (inclined) shape. The bit line contact CB may be formed of, for example, tungsten (W) or a polycrystalline silicon film.

In this case, the bit line contact CB is formed to have an elliptical shape in order to reduce contact resistance, and is disposed so that the major axis direction thereof is aligned with a bit line direction. In order to prevent the bit line contacts CB adjacent to each other in the X direction from coming into contact with each other, the adjacent bit line contacts are disposed to be shifted in the Y direction. The number of bit line contacts to be shifted is appropriately set depending on the degree of miniaturization, and for example, every three bit line contacts may be disposed to be shifted. Such disposition of the bit line contacts CB is called a staggered disposition.

Next, a manufacturing process having the above-mentioned configuration will be described with reference to FIGS. 4A to 4F to FIGS. 15A to 15F. Meanwhile, in FIGS. 4A to 4F, FIG. 4A is a plan view of a contact region between selection gate transistors on a drain side, FIG. 4B is a plan view of a contact region between selection gate transistors on a source side, and FIG. 4C is a plan view of a peripheral transistor. FIGS. 4D to 4F illustrate a longitudinal section of a portions cut by a cutting line illustrated in each of the plan views of FIG. 4A to 4C. FIGS. 5A to 5F to FIGS. 15A to 15F also illustrate portions corresponding to those in FIGS. 4A to 4F.

As illustrated in FIGS. 4A to 4F, the gate insulating film 3, the polycrystalline silicon film 4, and the silicon nitride film 18 for processing are formed on the entire top surface of the silicon substrate 2. Further, processing films 19 and 20 for sidewall transfer processing are sequentially formed on the top surface of the silicon nitride film 18. The processing film 19 may be formed from an amorphous silicon film capable of increasing etching selectivity with respect to the silicon nitride film 18 to be processed, a silicon film such as a polycrystalline silicon film, a silicon oxide film, or the like. In addition, a film capable of increasing etching selectivity with respect to the processing film 19 may be selected as the processing film 20. For example, when the processing film 19 is a silicon film, a silicon oxide film or a silicon nitride film may be selected. When the processing film 19 is a silicon oxide film, a silicon film or a silicon nitride film may be selected.

Next, as illustrated in FIGS. 5A to 5F, a core material pattern 20a is formed by patterning the processing film 20 in the memory cell region in a line shape. Here, a photoresist is applied on the entire surface using a photolithography technique, and line-and-space patterns are formed in the memory cell region at a disposition interval D1 to extend in the Y direction with a width size D1. Thus, as illustrated in FIGS. 5A, 5B, 5D, and 5E, the core material patterns 20a may be patterned to be disposed at the disposition interval D1 in the X direction. Thereafter, the photoresist film used for patterning is removed.

In this case, the width size D1 of the core material pattern 20a mentioned above is set as D1=2×d to be twice as large as a pattern width d of a line-and-space pattern to be finally formed. For example, the pattern width d may be set to a dimension equal to or less than a width size which is capable of being optically patterned by using a sidewall transfer technique to be described later.

Next, as illustrated in FIGS. 6A to 6F, the width size of the core material pattern 20a formed as described above is processed to a width size D2 (=D1/2=d) which is half of D1 to thereby form a core material pattern 20b. In this case, a slimming process is performed as a process of processing the core material pattern 20a. In the sliming process, the core material pattern 20a is selectively and isotropically etched to reduce the width size thereof. Thus, both side walls of the core material pattern 20a are etched by D2/2, and thus the core material pattern 20b having a width size of D2 is obtained.

Next, as illustrated in FIGS. 7A to 7F, a side wall pattern 21 is formed in both side wall portions of the core material pattern 20b. In this process, first, a film for forming a side wall pattern is formed on the entire surface with a film thickness of D2 (=d). The film for forming aside wall pattern is formed using a material capable of increasing etching selectivity with respect to the core material pattern 20b or the processing film 19 as a base layer. Thereafter, the film for forming a side wall pattern is subjected to etch-back processing using a reactive ion etching (RIE) method or the like to leave on both side wall portions of the core material pattern 20b in the form of a spacer, thereby forming the side wall pattern 21 having a width size D2. At this time, as illustrated in FIG. 7F, in a peripheral circuit portion, the processing film 20 remains in the entire surface as a base layer, and thus the film for forming the side wall pattern is formed in a flat state and is entirely removed during etching.

Next, as illustrated in FIGS. 8A to 8F, the core material pattern 20b remaining between the side wall patterns 21 is selectively etched, and patterning is performed by applying a photoresist to thereby form a resist pattern 22. In this case, as illustrated in FIG. 8F, the resist pattern 22 is formed so as to leave a resist film in the entire surface in the peripheral circuit portion. According to this embodiment, in this process, the resist pattern 22 is also disposed in a region where a source line contact of a portion having the selection gate electrodes SG on the source side in the memory cell region being disposed is formed. At this time, the width size of the resist pattern 22 in the Y direction is set to be smaller than a disposition interval between the selection gate electrodes SG on the source side.

Subsequently, the core material pattern 20b of an exposed portion is selectively removed through etching by using the resist pattern 22 as a mask. Thus, in the memory cell region, the side wall patterns 21 having the width size D2 are formed at a disposition interval D2. In the portion covered by the resist pattern 22 in a region where the source line contact of the memory cell region is formed, a state is set where the core material pattern 20c remains in a portion interposed between the side wall patterns 21.

Next, as illustrated in FIGS. 9A to 9F, the resist pattern 22 is removed through processing such as plasma asking. Thus, in the peripheral circuit region, a state where the processing film 20 remains in the entire surface is set as illustrated in FIG. 9F. In the memory cell region, the side wall pattern 21 is formed as a line-and-space pattern. Further, in a portion covered by the resist pattern 22 in a region where the source line contact of the memory cell region is formed, a state is set where the core material pattern 20c remains in a portion interposed between the side wall patterns 21 such that the core material pattern 20c is disposed between a pair of two side wall patterns 21.

Next, as illustrated in FIGS. 10A to 10F, the processing film 19 and the silicon nitride film 18 are etched by an RIE method or the like, using the processing film 20, the core material pattern 20c, and the side wall pattern 21 as masks. Thus, it is possible to form a hard mask for processing the polycrystalline silicon film 4, the gate insulating film 3, and the silicon substrate 2.

Subsequently, the polycrystalline silicon film 4, the gate insulating film 3, and the silicon substrate 2 serving as base layers are processed using the silicon nitride film 18 processed as a hard mask. The polycrystalline silicon film 4 and the gate insulating film 3 are removed by anisotropic etching such as an RIE method, and the silicon substrate 2 is etched down to a predetermined depth through etching.

In this case, as illustrated in FIG. 10D, a groove of the element isolation area Sb is formed in a line-and-space pattern with a width size corresponding to each transistor MT in a portion where the memory cell transistor MT in the memory cell region is formed. Thus, the surface layer portion of the silicon substrate 2 is formed to be divided into the element formation regions Sa. On the other hand, as illustrated in FIG. 10E, in a region where the source line contact of the memory cell region formed to leave the core material pattern 20c, a portion corresponding to the core material pattern 20c is not etched by being masked and thus remains as the coupling portion Sac. As a result, two element formation regions Sa are formed to be coupled by the coupling portion Sac, and thus the source region pattern SPT is obtained.

Next, as illustrated in FIGS. 11A to 11F, an element isolation insulating film is embedded into the grooves of the element isolation area Sb formed as described above. Here, for example, a coating type silicon oxide film 23 is formed on the entire surfaces. Subsequently, as illustrated in FIGS. 11C and 11F, patterning for forming a trench 2s is performed on the peripheral circuit portion by a photolithography technique in order to form an element isolation area of the peripheral circuit portion. Then, the silicon oxide film 23, the silicon nitride film 18, the polycrystalline silicon film 4, and the gate insulating film 3 are removed by etching such as an RIE method by using a photoresist as a mask, and the silicon substrate 2 is removed to a predetermined depth. Thus, an element formation region for forming a transistor PT of the peripheral circuit portion is provided in an island shape, and the trench 2s serving as an element isolation area is formed in the vicinity of the element formation region.

Next, as illustrated in FIGS. 12A to 12F, films for configuring gate electrodes of the memory cell transistor MT in the memory cell region, the selection gate transistor ST, and the transistor PT of the peripheral circuit portion are formed. In this case, first, from the states illustrated in FIGS. 11A to 11F, the coating type silicon oxide film 23 is formed on the entire surface to embed an element isolation insulating film also in the trench 2s which forms an element isolation area in the peripheral circuit region.

Subsequently, recessing the silicon oxide film 23 embedded in both the memory cell region and the peripheral circuit region is performed by etch-back processing. Meanwhile, after recessing the silicon oxide film 23, the silicon nitride film 18 is selectively removed, and thus a state where the polycrystalline silicon films 4 are exposed is set. Thereafter, the silicon oxide film 23 in the memory cell region is recessed to substantially an intermediate position of the polycrystalline silicon film 4 to form an element isolation insulating film 17. The silicon oxide film 23 in the peripheral circuit region is held by the position of the top surface of the polycrystalline silicon film 4, and thus is provided as the element isolation insulating film 17.

Subsequently, the inter-electrode insulating film 5, the first polycrystalline silicon film 6, and the second polycrystalline silicon film 7 are sequentially formed on the entire top surface of the above-mentioned configuration to thereby obtain the configurations illustrated in FIGS. 12A to 12F.

Next, as illustrated in FIGS. 13A to 13F, gate processing is performed by anisotropic etching such as an RIE method to thereby form the gate electrodes MG, SG, and PG. At this time, gate processing is performed on the memory cell region to thereby form the gate electrodes MG and SG. In the gate processing, pattern processing may be performed to have a width size D2 (=d) exceeding an exposure limit of photolithography using, for example, the above-mentioned sidewall transfer technique.

Thus, the word lines WL and the selection gate lines SGLD and SGLS are formed as illustrated in FIGS. 13A and 13B. Meanwhile, during the gate processing, the polycrystalline silicon films 7 and 6, the inter-electrode insulating film 5, and the polycrystalline silicon film 4 are removed by etching thereof, and the gate electrodes MG and SG are formed on the gate insulating film 3. At this time, the element isolation insulating film 17 within the element isolation groove is formed in a slightly dropped state.

Meanwhile, in the above-mentioned process, a case where the gate electrodes MG and SG are collectively formed is illustrated. However, the embodiment is not limited thereto, and the gate electrode MG may be formed and the gate electrode SG may be formed later. In this case, after the gate electrode MG is formed, the insulating film 9 is formed to cover a region between the gate electrodes MG, and then a contact region between the gate electrodes SG is opened, and thus the gate electrodes SG are processed in an independent state. In this state, impurities are introduced into the element formation regions Sa through the gate insulating films 3 exposed between the gate electrodes MG and MG, between the gate electrodes MG and SG, and between the gate electrodes SG and SG by an ion implantation method or the like to thereby provide the impurity regions 2a and 2b.

Next, as illustrated in FIGS. 14A to 14F, processing of filling a gap between the gate electrodes MG and SG formed as described above with an insulating film is performed. Here, as illustrated in FIG. 3A, the insulating film 9 for forming a gap is formed to cover the gate electrodes MG and SG in the memory cell region. The insulating film 9 is formed not to be embedded in the gap between the gate electrodes MG by forming, for example, a silicon oxide film under an inferior step coverage condition. Thus, the air gap AG is formed between the gate electrodes MG and MG and between the gate electrodes MG and SG which have a small width.

Next, the spacer 10 is formed on side wall surfaces of portions where the selection gate electrodes SG face each other. At this time, when the insulating film forming the spacer 10 is subjected to etch-back processing, the gate insulating film 3 formed on the surface of the silicon substrate 2 in the region between the selection gate electrodes SG is removed.

Subsequently, after the silicon oxide film 11 is formed, impurities are introduced between the selection gate electrodes SG and SG by an ion implantation method to thereby form the impurity region 2c. At this time, the impurity region 2c is formed up to a location deeper than the uppermost surface of each of the element isolation insulating films 17 of the element isolation areas Sb adjacent to each other on both sides in the X direction. Further, the silicon nitride film 12 and the interlayer insulating film 13 are formed, and the entire surface is flattened. Meanwhile, the above-mentioned formation of the impurity region 2c is performed after forming the silicon oxide film 11. Alternatively, the silicon nitride film 12 may be formed after the silicon oxide film 11, and then the impurity region 2c may be formed. Thereafter, a process of forming the interlayer insulating film 13 may be performed.

Next, as illustrated in FIGS. 15A to 15F, the bit line contact CB and the source line contact CS are formed by forming a contact hole in the interlayer insulating film 13 and embedding a conductor in the contact hole. Here, first, a contact hole for forming the bit line contact CB and a contact hole for forming the source line contact CS are simultaneously formed in the interlayer insulating film 13. Meanwhile, in FIGS. 15A and 15B, the interlayer insulating film 13, the silicon nitride film 12, and the silicon oxide film 11 are omitted.

Here, as illustrated in FIGS. 15A and 15D, for the bit line contact CB, a contact hole 13a is formed to form a contact in each of the element formation regions Sa in the contact region. Since the disposition interval between the element formation regions Sa adjacent to each other is small, the contact holes of the bit line contacts CB are disposed by shifting the positions thereof in the Y direction in a state where three contact holes are set to a group.

As illustrated in FIGS. 15B and 15E, when two element formation regions Sa connected by the coupling portion Sac form the source region pattern SPT, a contact hole 13b for forming the source line contact CS is disposed and formed in an elliptical pattern to be laid over an element isolation area Sb interposed between two source region patterns SPT. In this case, in a process of forming the contact hole 13b, an etching rate is decreased by the width of a processing surface area which is larger than that of the contact hole 13a of the bit line contact CB which is formed at the same time as the contact hole 13b, and thus the depth of the contact hole dug by etching is increased. As a result, in a portion where the contact hole 13b is formed, a shoulder portion of the element formation region Sa of the source region pattern SPT is slightly etched and thus has a round shape.

Meanwhile, in the above-mentioned processing, an opening of the contact hole 13b formed at the same time as the contact hole 13a may be set smaller than that of a pattern type of the related art. Thus, a pattern density difference in a case where the contact holes 13a and 13b are simultaneously processed may be made smaller than that in a case of a groove type of the related art. As a result, it is possible to suppress a loading effect in a portion of the contact hole 13b during processing the contact holes 13a and 13b.

In the formation of the contact hole 13b, patterning is performed so that only one side of a portion of the element formation region Sa of the source region pattern SPT of the semiconductor substrate 2 is etched. In a configuration of the related art, both shoulder portions are etched, and thus etching is performed so that the element formation region Sa is depressed as a whole. On the other hand, in this embodiment, only one shoulder portion is etched.

In the first embodiment, when the source line contact CS to be formed between the selection gate electrodes SG and SG on the source side is formed in the memory cell region, the source region pattern SPT is provided in which two adjacent element formation regions Sa are coupled to each other by the coupling portion Sac. Accordingly, the depression of the shoulder portion of the element formation region Sa of the silicon substrate 2 is reduced to thereby increase a distance between a diffusion layer and a contact on the source side, and thus it is possible to suppress junction leakage. Therefore, it is possible to suppress the amount of gouging of the silicon substrate 2 as compared with a case where the source line contact CS is formed by forming a groove in the X direction as in a configuration of the related art.

Further, as compared with a configuration in which a large number of element formation regions Sa between the selection gate electrodes SG are coupled to each other, it is possible to expect an improvement in the fluctuation of a threshold value of the selection gate transistor ST on the source due to the diffusion of impurities from the element formation region Sa located below the selection gate electrode SG.

Meanwhile, in this embodiment, a process of forming the resist pattern 22 for forming the source region pattern SPT in which the element formation regions Sa are coupled to each other by the coupling portion Sac may be performed at the same time as a process of forming the resist pattern covering the peripheral circuit portion when the core material pattern 20b is removed, and thus correspondence may be made by changing a pattern without causing an increase in the number of processes.

Second Embodiment

FIG. 16 and FIGS. 17A to 17C illustrate a second embodiment. In this embodiment, some of the components in the first embodiment are modified.

Figure 16:
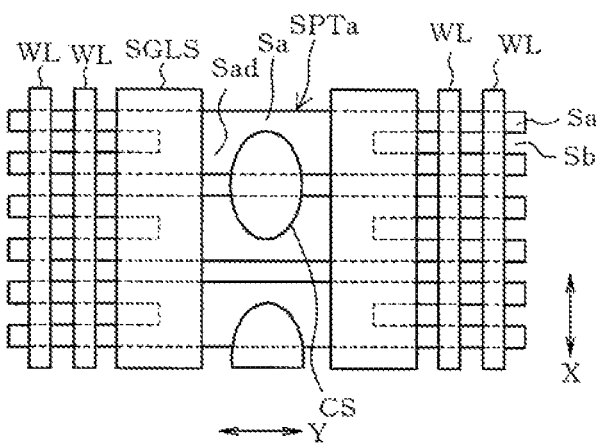
FIG. 16 is an example of a plan view of a contact region between selection gate transistors on a source side according to a second embodiment.

FIG. 16 illustrates the same portions as those in FIG. 15B according to the first embodiment. As illustrated in FIG. 16, in this embodiment, a source region pattern SPTa for forming a source line contact CS is configured so that element formation regions Sa are coupled to each other by a coupling portion Sad. The length of the coupling portion Sad in the Y direction is larger than that of the coupling portion Sac illustrated in the first embodiment. Both ends of the coupling portion Sad in the Y direction are provided to be located below a selection gate line SGLS configuring a gate electrode SG of the selection gate transistor ST. Therefore, a region where a source line contact is formed between the selection gate electrodes SG is provided as a source region pattern SPTa corresponding to a width size 3d in which two adjacent element formation regions Sa are coupled to each other by the coupling portion Sad.

Figure 17A:
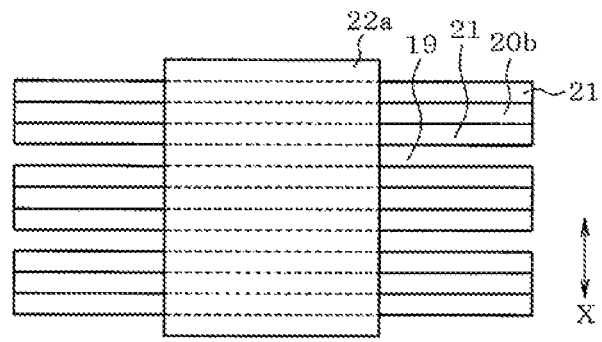
FIGS. 17A to 17C are plan views of a contact region between selection gate transistors on a source side which illustrate each step of a manufacturing process.
Figure 17B:
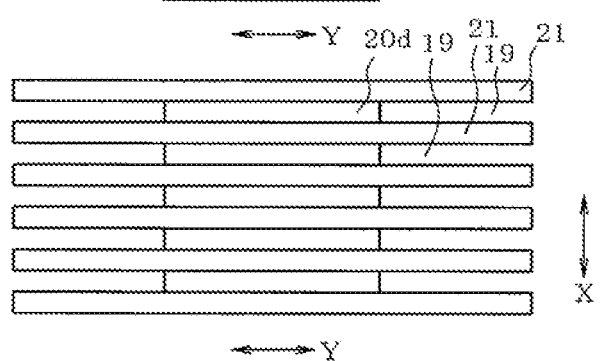
Figure 17C:
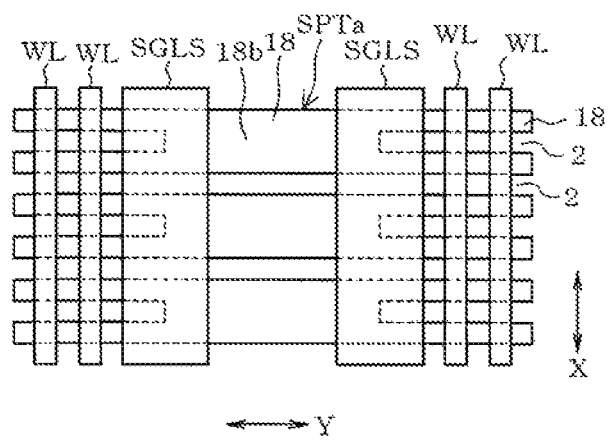

FIGS. 17A to 17C illustrate a portion of a manufacturing process configured as described above, and thus differences from the first embodiment will be briefly described. That is, in this embodiment, a resist pattern 22a as illustrated in FIG. 17A is formed instead of the resist pattern 22 of FIG. 8B according to the first embodiment. The width size of the resist pattern 22a in the Y direction is set large, and both ends thereof extend to a location in the vicinity of a center portion of the gate electrode SG of the selection gate transistor ST.

As illustrated in FIG. 17A, the resist pattern 22a is used to selectively etch a core material pattern 20b remaining between side wall patterns 21, and is formed by applying a photoresist and performing patterning thereon. As described above, the resist pattern 22a may be patterned at the same time as when the resist pattern 22a is formed to leave a resist film in the entire surface in a peripheral circuit portion, as illustrated in FIG. 8F.

Subsequently, the core material pattern 20b of an exposed portion is selectively etched and removed by using the resist pattern 22a as a mask. Thus, in a memory cell region, the side wall patterns 21 having a width size D2 are formed in a state where the patterns are disposed at a disposition interval D2. In addition, in the area covered by the resist pattern 22 in a region where a source line contact of the memory cell region is formed, the core material pattern 20d interposed between the side wall patterns 21 remains.

Next, as illustrated in FIG. 17B, the resist pattern 22a is removed by processing such as plasma asking. Thus, as illustrated in FIG. 9F, the processing film 20 remains in the entire surface in the peripheral circuit region. In the memory cell region, the side wall pattern 21 is formed as a line-and-space pattern. Further, in a portion covered by the resist pattern 22a in a region where the source line contact of the memory cell region is formed, a state is set where the core material pattern 20d remains in a portion interposed between the side wall patterns 21 and where the core material pattern 20d is disposed between a pair of two side wall patterns 21.

Thereafter, similarly to the first embodiment, a processing film 19 and a silicon nitride film 18 are etched by using the processing film 20, the core material pattern 20d, and the side wall pattern 21 as masks to thereby form a hard mask. A polycrystalline silicon film 4 and a gate insulating film 3 are removed through etching by using the hard mask, and the silicon substrate 2 is etched to a predetermined depth. Thus, the surface layer portion of the silicon substrate 2 is formed to be divided into the element formation regions Sa. As illustrated in FIG. 17C, in the source region pattern SPTa of the memory cell region formed to leave the core material pattern 20d, a portion corresponding to the core material pattern 20d is not etched by being masked and thus remains as the coupling portion Sad. As a result, the source region pattern SPTa in which two element formation regions Sa are coupled to each other by the coupling portion Sad is formed.

Further, an element isolation insulating film is embedded in the groove of the element isolation area Sb, and films configuring gate electrodes of a memory cell transistor MT in the memory cell region, a selection gate transistor ST, and a transistor PT of the peripheral circuit portion are formed.

Next, as illustrated in FIG. 17C, the gate electrodes MG, SG, and PG are formed by performing gate processing. Accordingly, word lines WL and selection gate lines SGLD and SGLS are formed. Thus, both ends of the coupling portion Sad in the Y direction are provided to be located below the selection gate line SGLS configuring the gate electrode SG of the selection gate transistor ST.

The same operational effects as in the first embodiment may be obtained also by this configuration. In addition, the coupling portion Sad coupling the element formation regions Sa is extended, and thus it is possible to set the source region pattern SPTa having a large width size over the entirety of a region where the source line contact is formed in the Y direction. Accordingly, it is possible to increase an allowable degree of a positional deviation during forming the resist pattern 22a and to increase an allowable degree of a positional deviation of the location at which the source line contact CS is formed.

Meanwhile, the source region pattern SPTa is provided up to a lower portion of the selection gate electrode SG in a state where coupling by the coupling portion Sad is performed, and the same operation characteristics as in the first embodiment may be used.

Third Embodiment

Figure 18A:
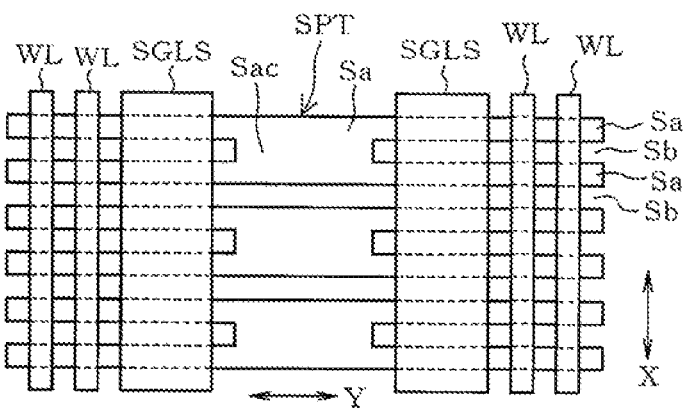
FIGS. 18A to 18D are plan views of a contact region between selection gate transistors on a source side which illustrate each example according to a third embodiment.
Figure 18B:
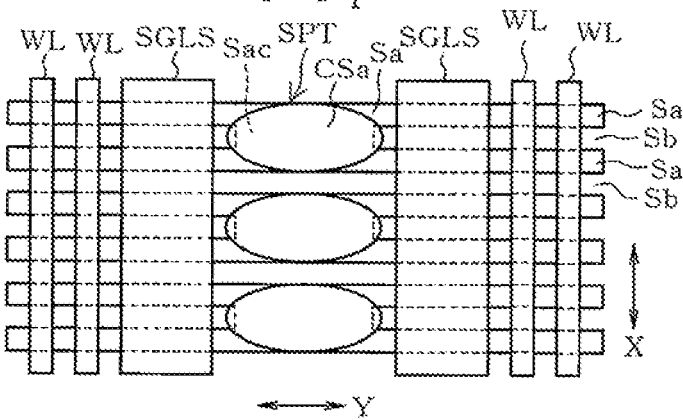
Figure 18C:
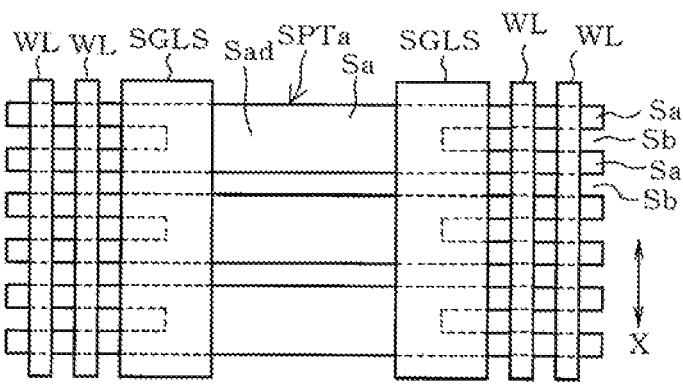
Figure 18D:
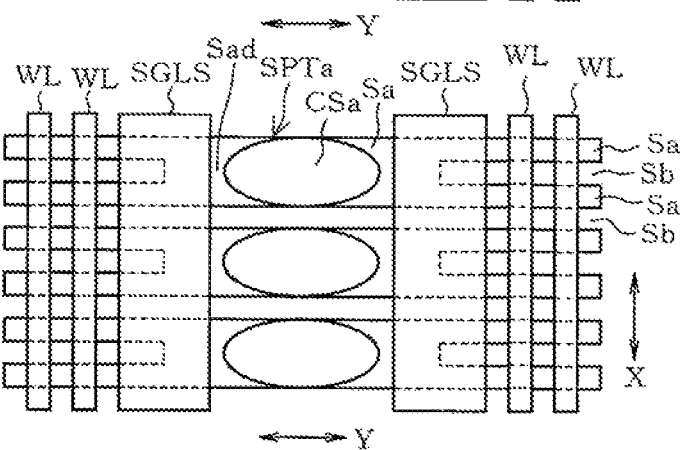

FIGS. 18A to 18D illustrate a third embodiment. In the third embodiment, a modification example corresponding to the first embodiment mentioned above is illustrated in FIGS. 18A and 18B, and a modification example corresponding to the second embodiment is illustrated in FIGS. 18C and 18D.

In this embodiment, as illustrated in FIGS. 18B and 18D, a disposition form of a source line contact CS is changed. That is, in the first embodiment and the second embodiment, the source line contact CS having an elliptical shape is configured so that the major axis thereof is directed to the X direction. On the other hand, in this embodiment, a source line contact CSa is configured so that the major axis thereof is directed to the Y direction.

In the configurations illustrated in FIGS. 18A and 18B, a source region pattern SPT is formed in which two adjacent element formation regions Sa are coupled to each other by a coupling portion Sac, and the source line contact CSa is disposed on the source region pattern. In the configurations illustrated in FIGS. 18C and 18D, a source region pattern SPTa is formed in which two adjacent element formation regions Sa are coupled by a coupling portion Sad, and a source line contact CSa is disposed in the source region pattern.

It is possible to set the dimension of the source line contact CSa in the X direction, that is, the dimension of the minor axis to a width corresponding to three element formation regions Sa by adopting the above-mentioned configuration. In addition, it is possible to set the dimension of the source line contact CSa in the Y direction, that is, the dimension of the major axis in a range of a distance between the selection gate electrodes SG and SG, that is, the dimension of a range in which the source line contact is formed in the Y direction. In this case, the dimension of the major axis is set in consideration of the contact resistance of the source line contact CSa, and the like.

The same effects as in the first and second embodiments may be obtained also by the third embodiment. In this embodiment, the source line contact CSa may be formed to come into contact with the top surfaces of the element formation region Sa and the coupling portion Sad and may be formed so as not to come into contact with a shoulder portion. As a result, it is possible to prevent junction leakage, caused by the etching of an element isolation insulating film between the element formation regions Sa, from occurring.

Meanwhile, in the above-mentioned configuration, it is not possible to maintain a large disposition interval between the source line contacts CSa adjacent to each other in the X direction. Accordingly, when it is not possible to secure a predetermined distance in a range of a photolithography technique, it is possible to adopt a staggered disposition in which the contacts are shifted in the Y direction, for example, in the same manner as a drain contact CD. In this case, it is possible to set a width size of the source region pattern SPT in the Y direction to a width size necessary for the staggered disposition. Also in this case, the setting may be performed without significantly increasing a dimension.

Other Embodiments

In addition to the above-described embodiments, the following modifications may be made.

A configuration may be adopted in which the plurality of source line contacts CS described in the first embodiment are disposed in the Y direction.

A staggered disposition may be adopted in which the adjacent source line contacts CS described in the first embodiment are shifted in the Y direction.

A NAND type flash memory device which is not provided with an air gap AG may be used.

The source line contacts CSa described in the third embodiment may be formed to be laid over a plurality of source region patterns.

A case where a NAND type flash memory device is used has been described, but it is possible to use any semiconductor device which is configured so that a contact is formed in an upper layer portion through a large number of lower layer wirings and an interlayer insulating film which are disposed in a line-and-space pattern.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
a semiconductor substrate;
element formation regions extending in a line-and-space pattern in a first direction in a surface layer of the semiconductor substrate;

a coupling portion selectively positioned in the surface layer of the semiconductor substrate to couple, in a second direction intersecting the first direction, element formation regions adjacent to each other;

an insulating film disposed over the coupling portion located between the element formation regions;

a source line over the insulating film at an upper layer of the semiconductor substrate; and a source line contact, having a circular or elliptical cross section, electrically connecting element formation regions at a location thereof coupled by the coupling portion with the source line.

2. The semiconductor device according to claim 1, wherein the source line contact extends through the insulating film in a location of the insulating film overlying a coupling portion interposed between adjacent element formation regions.

3. The semiconductor device according to claim 2, further comprising;
a bit line wiring layer; and
a bit line contact, having a circular or elliptical cross section, electrically connecting the element formation regions and a wiring layer located on the insulating film.

4. The semiconductor device according to claim 1, wherein
a plurality of source region patterns are provided, and
the source line contact contacts each of the plurality of source region patterns.

5. The semiconductor device according to claim 4, wherein
the element formation regions are separated, and spaced apart by, element isolation insulating films which are embedded in grooves in the semiconductor substrate, and
the element isolation insulating film in an area where the source line contact contacts an element formation region, extends to a position above the depth of an impurity region of the source region pattern.

6. The semiconductor device according to claim 4, wherein the upper portion of an element formation region adjacent to the source line contact has a curvature which is larger than a curvature of the upper surface of the same element formation region at a location not adjacent to the source line contact.

7. The semiconductor device according to claim 1, wherein the source line contact has an elliptical shape and is disposed so that a major axis of the source line contact extends in the second direction.

8. The semiconductor device according to claim 7, wherein the source line contact extends over two element formation regions not having the coupling portion interposed therebetween.

9. The semiconductor device according to claim 7, wherein the end of the coupling portion extends below two adjacent selection gate electrodes.

10. The semiconductor device according to claim 7, wherein the source line contact has an elliptical cross section and the major axis thereof extends in the first direction.

11. The semiconductor device according to claim 10, wherein the source line contact is formed over a coupling portion.

12. The semiconductor device according to claim 10, wherein the coupling portion extends below two adjacent selection gate electrodes.

13. The semiconductor device according to claim 10, wherein the source line contact has an elliptical cross section and the major axis of the source line contact extends in the first direction.

14. The semiconductor device according to claim 1, wherein the coupling portion is provided in a region interposed between two selection gate electrodes.

15. A semiconductor memory device wherein the element formation regions extending as lines and separated by a trench isolation structure have a width dimension below the resolution dimension of optical lithography, comprising
at least two element formation lines extending in a first direction and spaced apart in a second direction orthogonal to the first direction;
an element isolation material formed in a first location in the space between the element formation lines;
a connecting portion interposed between and contacting the element formation lines in a second location;
an insulating layer formed over the second location; and
a contact extending through the insulating layer and contacting the element formation lines and the connecting portion.

16. The semiconductor device of claim 15, further comprising:
a selection transistor having a gate, the gate of a selection gate transistor disposed immediately adjacent to, and on opposed sides of, the connecting portion.

17. The semiconductor device of claim 16, wherein the connecting portion extends below at least a portion of the gate of the selection transistor.

18. The semiconductor device of claim 15, further comprising;
an additional two element formation lines extending in a first direction and spaced apart in a second direction intersecting the first direction; and
an element isolation material formed in a first location of the space between the additional two element formation lines, wherein
the contact extending through the insulating layer is disposed over at least one of the element formation lines and at least one of the additional element formation lines.

19. A method of forming a contact through an insulating layer located over an element formation region extending as lines and separated by a trench isolation structure have a width dimension below the resolution size of optical lithography, comprising:
providing a first connecting portion in the trench located between a first and second line of the lines, the first connecting portion contacting the first and second lines and providing a second connecting portion in the trench located between a third and fourth line of the lines, the second connecting portion in contact with the third and fourth lines, wherein the second and the third lines are separated by the trench isolation structure; and
positioning the contact extending through the insulating layer over the second line and the third line and over the portion of the trench isolation structure therebetween.

20. The method of claim 19, wherein the contact has an elliptical cross section.

* * * * *